United States Patent
Zhou et al.

(10) Patent No.: US 8,525,191 B2
(45) Date of Patent: Sep. 3, 2013

(54) OPTOELECTRONIC DEVICES AND COATINGS THEREFORE

(75) Inventors: Jian Zhou, Evansville, IN (US); James Edward Pickett, Schenectady, NY (US); Shreyas Chakravarti, Evansville, IN (US)

(73) Assignee: Sabic Innovative Plastics IP B.V. (NL)

( * ) Notice: Subject to any disclaimer, the term of this patent is extended or adjusted under 35 U.S.C. 154(b) by 0 days.

(21) Appl. No.: 13/435,161

(22) Filed: Mar. 30, 2012

(65) Prior Publication Data

US 2012/0248497 A1 Oct. 4, 2012

Related U.S. Application Data

(63) Continuation-in-part of application No. 13/078,180, filed on Apr. 1, 2011, now Pat. No. 8,350,275.

(51) Int. Cl.
| | |
|---|---|
| H01L 27/15 | (2006.01) |
| H01L 29/26 | (2006.01) |
| H01L 31/12 | (2006.01) |
| H01L 33/00 | (2010.01) |
| H01L 29/165 | (2006.01) |
| H01L 31/153 | (2006.01) |

(52) U.S. Cl.
USPC  257/80; 257/85; 257/E31.096; 257/E31.099; 257/E31.105; 257/E33.076; 257/E33.077; 257/E51.036

(58) Field of Classification Search
USPC ....... 257/80, 85, E31.096, E31.099, E31.105, 257/E33.076, E33.077, E51.036
See application file for complete search history.

(56) References Cited

U.S. PATENT DOCUMENTS

| | | | |
|---|---|---|---|
| 3,444,129 A | 5/1969 | Young et al. | |
| 3,460,961 A | 8/1969 | Young et al. | |
| 3,492,261 A | 1/1970 | Young et al. | |
| 3,503,779 A | 3/1970 | Young et al. | |
| 4,134,936 A * | 1/1979 | Byrne et al. | 525/469 |
| 4,355,150 A * | 10/1982 | Bosnyak et al. | 528/176 |
| 4,364,786 A * | 12/1982 | Smith et al. | 156/99 |

(Continued)

FOREIGN PATENT DOCUMENTS

| | | |
|---|---|---|
| CN | 101506267 A | 8/2009 |
| CN | 101528805 A | 9/2009 |

(Continued)

OTHER PUBLICATIONS

Chinese Patent No. 101506267 (A); Publication Date: Aug. 12, 2009; Abstract Only; 1 Page.

(Continued)

Primary Examiner — Ida M Soward
(74) Attorney, Agent, or Firm — Cantor Colburn LLP

(57) ABSTRACT

An optoelectronic device assembly can include: a coated element and an optoelectronic device on the coated element. The coated element can include a thermoplastic substrate and a protective weathering layer. The thermoplastic substrate can include a bisphenol-A polycarbonate homopolymer and a polycarbonate copolymer, and wherein the polycarbonate copolymer is selected from a copolymer of tetrabromo-bisphenol A carbonate and BPA carbonate; a copolymer of 2-phenyl-3,3-bis(4-hydroxyphenyl)phthalimidine carbonate and BPA carbonate; a copolymer of 4,4'-(1-phenylethylidene) biphenol carbonate and BPA carbonate; a copolymer of 4,4'-(1-methylethylidene) bis[2,6-dimethyl-phenol]carbonate and BPA carbonate; and combinations comprising at least one of the foregoing. The protective weathering layer can include resorcinol polyarylate and polycarbonate.

25 Claims, 3 Drawing Sheets

(56) References Cited

U.S. PATENT DOCUMENTS

| | | | | |
|---|---|---|---|---|
| 4,465,814 A | * | 8/1984 | Bosnyak et al. | 525/439 |
| 4,994,318 A | | 2/1991 | Patel | |
| 5,091,258 A | | 2/1992 | Moran | |
| 5,153,023 A | * | 10/1992 | Orlowski et al. | 427/555 |
| 5,338,370 A | | 8/1994 | Aoike | |
| 5,391,795 A | | 2/1995 | Pickett | |
| 5,426,131 A | | 6/1995 | Katsamberis | |
| 5,474,620 A | | 12/1995 | Nath et al. | |
| 5,482,571 A | * | 1/1996 | Yamada et al. | 136/259 |
| 5,529,654 A | | 6/1996 | Kavanagh et al. | |
| 5,614,581 A | * | 3/1997 | Cobbledick et al. | 524/495 |
| 5,633,049 A | | 5/1997 | Bilkadi et al. | |
| 5,731,050 A | * | 3/1998 | Kotsubo et al. | 428/1.54 |
| 5,840,429 A | * | 11/1998 | Rukavina et al. | 428/412 |
| 5,869,185 A | | 2/1999 | Bahr et al. | |
| 5,958,598 A | | 9/1999 | Khudyakov et al. | |
| 6,093,757 A | | 7/2000 | Pern | |
| 6,172,296 B1 | | 1/2001 | Iwasaki et al. | |
| 6,265,522 B1 | | 7/2001 | Brunelle et al. | |
| 6,291,589 B1 | | 9/2001 | Brunelle et al. | |
| 6,294,647 B1 | | 9/2001 | Brunelle et al. | |
| 6,306,507 B1 | | 10/2001 | Brunelle et al. | |
| 6,329,588 B1 | | 12/2001 | Zander et al. | |
| 6,350,521 B1 | | 2/2002 | Chen et al. | |
| 6,426,125 B1 | | 7/2002 | Yang et al. | |
| 6,572,965 B1 | | 6/2003 | McGee et al. | |
| 6,577,657 B1 | * | 6/2003 | Elschner et al. | 372/39 |
| 6,596,843 B2 | | 7/2003 | Brunelle et al. | |
| 6,607,814 B2 | | 8/2003 | Pickett et al. | |
| 6,610,409 B2 | | 8/2003 | Pickett et al. | |
| 6,664,366 B2 | | 12/2003 | Silva et al. | |
| 6,689,474 B2 | | 2/2004 | Pickett et al. | |
| 6,861,482 B2 | | 3/2005 | Brunelle et al. | |
| 6,875,499 B1 | | 4/2005 | De Toffol et al. | |
| 7,015,640 B2 | | 3/2006 | Schaepkens et al. | |
| 7,169,859 B2 | | 1/2007 | Davis et al. | |
| RE40,508 E | | 9/2008 | Brunelle et al. | |
| 7,605,221 B2 | | 10/2009 | Davis et al. | |
| 7,635,792 B1 | | 12/2009 | Cella et al. | |
| 7,671,164 B2 | * | 3/2010 | Brack et al. | 528/190 |
| 7,709,576 B2 | * | 5/2010 | Gallucci | 525/189 |
| 7,790,292 B2 | * | 9/2010 | Colborn et al. | 428/447 |
| 7,808,692 B2 | * | 10/2010 | Karmhag et al. | 359/265 |
| 7,838,602 B2 | | 11/2010 | Davis et al. | |
| 8,052,900 B2 | * | 11/2011 | Fukushima | 252/589 |
| 8,216,357 B2 | * | 7/2012 | Pickett | 106/287.21 |
| 2003/0129409 A1 | | 7/2003 | Tacke-Willemsen | |
| 2004/0096666 A1 | | 5/2004 | Knox et al. | |
| 2005/0003208 A1 | * | 1/2005 | Graf et al. | 428/426 |
| 2006/0001040 A1 | | 1/2006 | Kim et al. | |
| 2006/0093786 A1 | | 5/2006 | Ohashi et al. | |
| 2006/0227427 A1 | | 10/2006 | Dolgoff | |
| 2007/0092707 A1 | * | 4/2007 | Anderson et al. | 428/292.1 |
| 2007/0129492 A1 | | 6/2007 | Colborn et al. | |
| 2007/0224464 A1 | | 9/2007 | Balasubramanian et al. | |
| 2007/0225454 A1 | | 9/2007 | Lewis et al. | |
| 2007/0273817 A1 | * | 11/2007 | Lee et al. | 349/119 |
| 2008/0000524 A1 | | 1/2008 | Deng | |
| 2008/0138538 A1 | | 6/2008 | Lewis et al. | |
| 2008/0138539 A1 | | 6/2008 | Breitung et al. | |
| 2008/0138624 A1 | | 6/2008 | Lewis et al. | |
| 2008/0295889 A1 | | 12/2008 | Schindler et al. | |
| 2008/0299384 A1 | | 12/2008 | Kim et al. | |
| 2009/0126778 A1 | | 5/2009 | Brounne et al. | |
| 2009/0186440 A1 | | 7/2009 | Duggal et al. | |
| 2009/0194166 A1 | | 8/2009 | Powell et al. | |
| 2009/0286010 A1 | | 11/2009 | Erlat et al. | |
| 2010/0032008 A1 | | 2/2010 | Adekore | |
| 2010/0043875 A1 | | 2/2010 | Bhaumik et al. | |
| 2010/0043878 A1 | | 2/2010 | Bhaumik et al. | |
| 2010/0043879 A1 | | 2/2010 | Bhaumik et al. | |
| 2010/0043880 A1 | | 2/2010 | Bhaumik et al. | |
| 2010/0060833 A1 | | 3/2010 | Ochiai et al. | |
| 2010/0119833 A1 | | 5/2010 | Madsen et al. | |
| 2010/0252101 A1 | * | 10/2010 | Noguchi et al. | 136/256 |
| 2010/0270537 A1 | | 10/2010 | Ye et al. | |
| 2011/0073171 A1 | | 3/2011 | Pickett | |
| 2011/0151218 A1 | | 6/2011 | Meyer Zu Berstenhorst et al. | |
| 2011/0189812 A1 | | 8/2011 | Brabec et al. | |
| 2012/0148835 A1 | * | 6/2012 | Radkowski et al. | 428/336 |

FOREIGN PATENT DOCUMENTS

| | | |
|---|---|---|
| DE | 60022039 T2 | 5/2006 |
| EP | 2211390 A1 | 7/2010 |
| KR | 20090021194 A | 2/2009 |
| WO | 0061664 A1 | 10/2000 |
| WO | 0069945 A1 | 11/2000 |
| WO | 2008002757 A1 | 1/2008 |
| WO | 2008021673 A1 | 2/2008 |

OTHER PUBLICATIONS

Chinese Patent No. 101528805 (A); Publication Date: Sep. 9, 2009; Abstract Only; 1 Page.

South Korean Patent No. 20090021191 (A); Publication Date: Feb. 27, 2009; Abstract Only; 1 Page.

German Patent No. 60022039 (T2); Publication Date: May 24, 2006; Abstract Only; 1 Page.

ASTM G 155-00a; "Standard Practice for Operating Xenon Arc Light Apparatus for Exposure of Non-Metallic Materials"; Jan. 10, 2005; 8 Pages.

Cohen et al.; "Transparent Ultraviolet-Barrier Coatings"; Journal of Polymer Science: Part A-1; vol. 9; 1971; pp. 3263-3299.

Pickett et al.; "Weathering Characteristics of Resorcinol Polyarylate Copolymers"; Polymer Preprints; vol. 48, Issue 1; 2007; pp. 643-644.

Pickett, J. E., "Highly Predictive Accelerated Weathering of Engineering Thermoplastics", Service Life Prediction: Callenging the Status Quo; Chapter 6; 2005; 9 Pages.

Pickett, J. E.; "UV Absorber Permanence and Coating Lifetimes"; Journal of Testing and Evaluation; vol. 32, No. 3; May 2004; pp. 240-245.

International Search Report; International Application No. PCT/US2012/031384; International Filing Date: Mar. 30, 2012; Date of Mailing: Jan. 25, 2013; 5 Pages.

Written Opinion of the International Searching Authority; International Applicatin No. PCT/US2012/031384; International Filing Date: Mar. 30, 2012; Date of Mailing: Jan. 25, 2013; 8 Pages.

\* cited by examiner

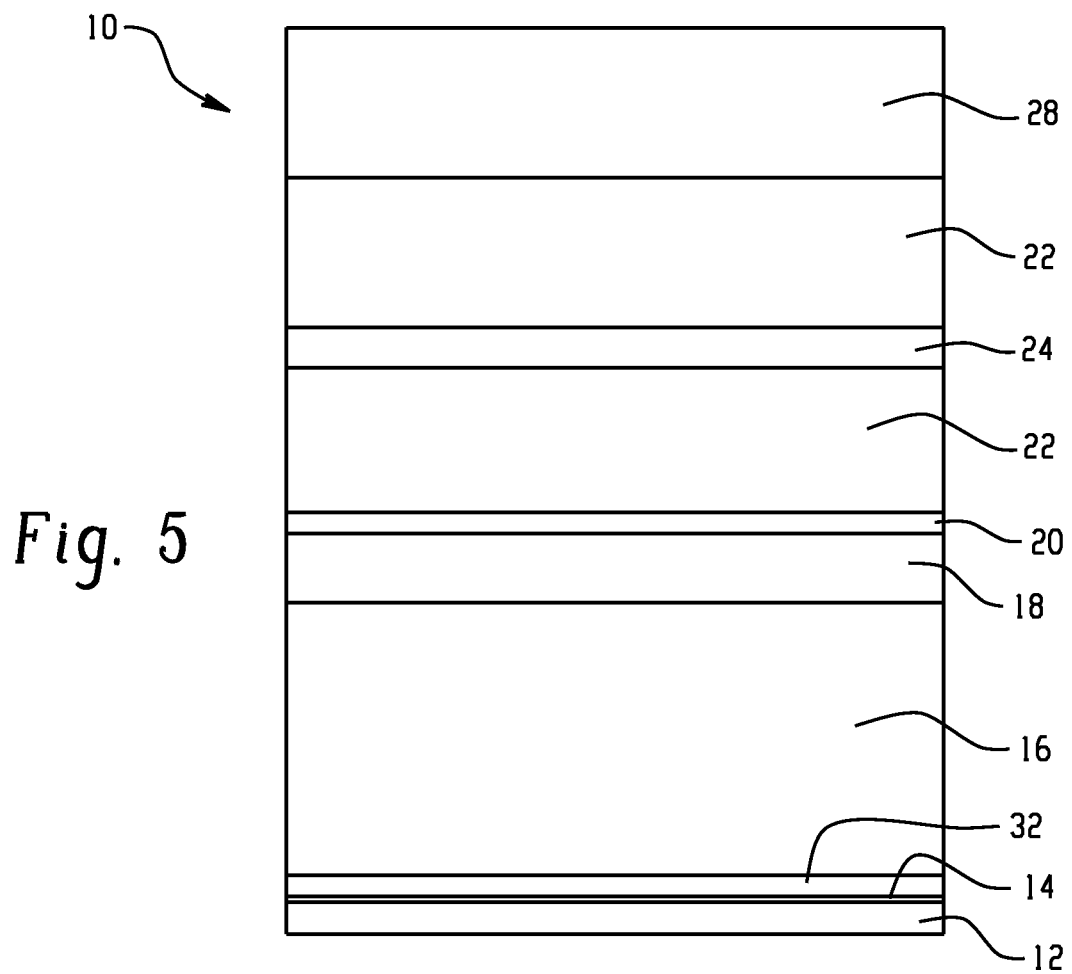

OPTOELECTRONIC DEVICES AND COATINGS THEREFORE

BACKGROUND

Disclosed herein are optically transparent, plastic, protective article assemblies, and specifically, optically transparent, weatherable, plastic that can protect optoelectronic devices, such as photovoltaic modules.

Photovoltaic (PV) modules have traditionally employed glass as a rigid superstrate, elastomeric encapsulation layers, and a polymeric backing sheet, making them relatively heavy and inflexible. More recently, flexible, lightweight modules have been made using thin film photovoltaic cells, such as amorphous silicon, and a transparent polymer film to allow light to enter and to protect the cell from the elements.

The transparent polymer film must meet a number of stringent requirements. It must have good transmission of light between the wavelengths of about 400 nm to about 1,200 nm and must protect the module components from physical damage and moisture. In particular, entry of liquid water into the module will inevitably cause corrosion and loss of performance. Cuts into the module can expose electrical components. Resistance toward cut damage is required by Underwriters Laboratories specification UL 1703 for Flat-Plate Photovoltaic Modules and Panels, for example. It is therefore essential that the polymer film covering the module be sufficiently tough toward physical damage. In addition, the film must retain its properties for long periods in use. Typically, lifetimes of twenty years or more are expected for photovoltaic modules. Few kinds of polymers have both adequate physical properties and sufficient resistance toward outdoor weathering under the high temperatures and full sun conditions of a photovoltaic module.

The current art employs a fluorocarbon polymer such as poly(ethylene-co-tetrafluoroethylene) (ETFE) available commercially as Tefzel* film from DuPont. Fluorocarbon polymers are extremely resistant toward weathering, and can easily endure twenty or more years in this application. However, fluorocarbon polymers are both relatively soft and relatively expensive. As a result, it is difficult to construct a module that has both low cost and has sufficient film thickness to avoid cut or puncture damage. One solution has been the introduction of glass fibers into the encapsulant layers to improve the cut resistance of a module based on an ETFE. While the glass fibers can protect against cuts deep enough to expose the electrical components and thereby pass the UL1703 standard, it is not clear that the integrity of the envelope toward water penetration is retained. Since these modules can be deployed directly on flat or angled roofs, damage is likely over the lifetime of the module.

Some photovoltaic cells require protection not just from liquid water but also from water vapor. Efficient cells can be made using cadmium telluride (CdTe) or from copper indium gallium selenide (CIGS), for example. However, these cells rapidly lose efficiency when exposed to water vapor. Since optoelectronic devices for outdoor applications, such as solar cells, currently carry a 20-25 year guarantee for outdoor use, these devices are protected from moisture, oxygen, and hail, with glass, which protects while at the same time still allowing solar spectrum to enter the device. Glass, however, is more rigid, brittle, and heavy.

Thus, there is a need for light weight (compared to glass) optoelectronic devices that are highly weatherable, tough, puncture resistant, and/or water vapor resistant.

SUMMARY

Disclosed, in various embodiments, are optoelectronic devices and coatings therefore, and methods for making and using the same.

In one embodiment, an optoelectronic device assembly comprises: a coated element and an optoelectronic device on the coated element. The coated element can comprise a thermoplastic substrate and a protective weathering layer. The thermoplastic substrate can comprise a bisphenol-A polycarbonate homopolymer and a polycarbonate copolymer, and wherein the polycarbonate copolymer is selected from a copolymer of tetrabromobisphenol A carbonate and BPA carbonate; a copolymer of 2-phenyl-3,3-bis(4-hydroxyphenyl) phthalimidine carbonate and BPA carbonate; a copolymer of 4,4'-(1-phenylethylidene)biphenol carbonate and BPA carbonate; a copolymer of 4,4'-(1-methylethylidene)bis[2,6-dimethyl-phenol]carbonate and BPA carbonate; and combinations comprising at least one of the foregoing. The protective weathering layer can comprise resorcinol polyarylate and polycarbonate.

In an embodiment, an optoelectronic device assembly comprises a coated element and an optoelectronic device. The coated element comprises a thermoplastic substrate and a protective weathering layer. The thermoplastic substrate comprises a material selected from aromatic polycarbonate and polyester, and combinations comprising at least one of the foregoing materials. The protective weathering layer comprises a UV absorber and a block copolymer comprising the resorcinol polyarylate and the polycarbonate, wherein the block copolymer has a resorcinol polyarylate block content of less than or equal to 40 wt %. The wherein the protective weathering layer comprises a block copolymer comprising the resorcinol polyarylate and the polycarbonate, and wherein the block copolymer has a resorcinol polyarylate block content of less than or equal to 40 wt % optoelectronic device can be selected from a light emitting diode and a photovoltaic cell.

These and other features and characteristics are more particularly described below.

BRIEF DESCRIPTION OF THE DRAWINGS

The following is a brief description of the drawings wherein like elements are numbered alike and which are presented for the purposes of illustrating the exemplary embodiments disclosed herein and not for the purposes of limiting the same.

FIG. 5 is a cross-sectional, schematic representation of another exemplary assembly.

DETAILED DESCRIPTION

Figure 1:
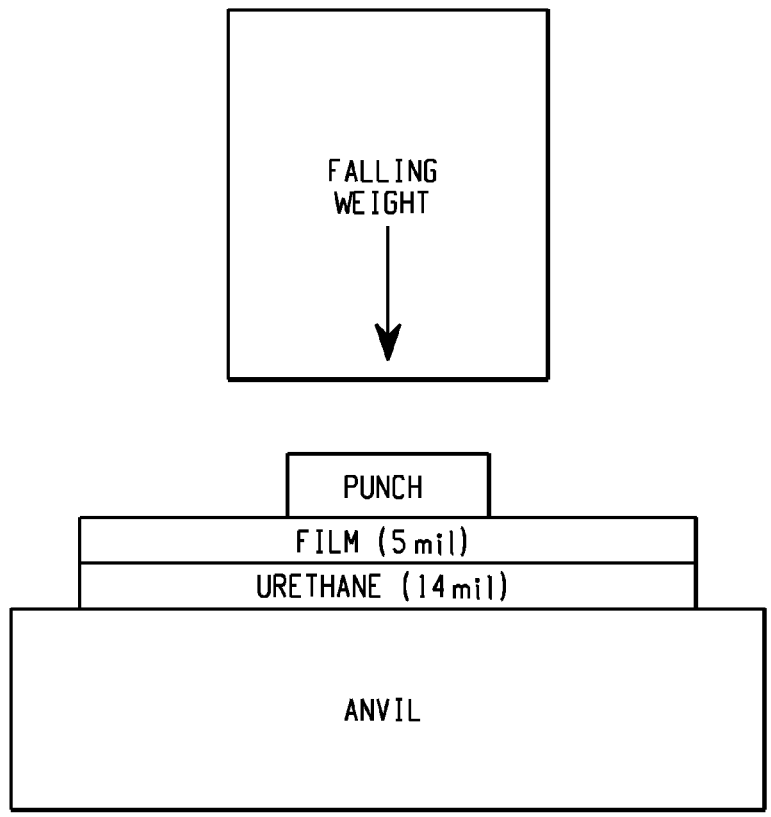
FIG. 1 is a schematic representation of a puncture test.

Optoelectronic devices such as solar cells are particularly difficult to protect with a polymer material due to the very harsh conditions in which they operate and the fact that their expected life is greater than or equal to 20 years (e.g., manufacturer 20 year guarantee). The modules are used outdoors, particularly in areas of high heat and sun. As a result, they are exposed to particularly harsh ultraviolet radiation (UV) and thermal conditions. The thermal conditions are further exasperated by the fact that the modules are a dark color, e.g., black, which further enhances their thermal absorption. Attempts to utilize various polymer materials have failed, including those considered to be "weatherable". Generally, polymer films and sheets were considered weatherable if they could withstand greater than three years of weathering exposed at a south-facing 45° angle at a Miami, Fla. or Phoenix, Ariz. test site. However, these materials do not have the extreme weatherability capability needed in the photovoltaic modules where the materials need to withstand more than 20 years of exposure under the conditions of full sun and high temperature (hereinafter referred to as extreme weatherability). It was discovered that even many UV protective materials (e.g., coated on a polymer such as polycarbonate) failed to protect the polymer under the present conditions of extreme weatherability. As a result, artisans do not consider engineering thermoplastics as an option for optoelectronic devices (e.g., photovoltaic cells, light emitting diodes (LED) (including organic light emitting diodes (OLED)), and so forth) that require extreme weatherability.

Unless specified otherwise, the extreme weatherability discussed herein is measured in a xenon arc accelerated weathering chamber such as a Ci5000 Weather-ometer (a product of Atlas Material Testing Technology, LLC) using lamp filters to give a good match to natural solar radiation. The filters can be a combination of quartz and infrared (IR)-reflecting sodalime glass (CIRA-sodalime) or the combination of RightLight* and CIRA-quartz. The CIRA and RightLight* filters are commercially available from Atlas Material Testing Technology, LLC, Chicago, Ill. The correlation between these conditions and one year outdoor weathering in Miami, Fla. is estimated to be approximately 3 megajoules per square meter ($MJ/m^2$) measured at 340 nm in *Service Life Prediction: Challenging the Status Quo*, J. W. Martin, R. A. Ryntz, and R. A. Dickie, Eds., *Federation of Societies for Coatings Technology*, 2005, pp 93-106.

As noted above, besides glass, poly(ethylene-co-tetrafluoroethylene) (ETFE) has been employed in optoelectronic devices, but this material has problems such as insufficient mechanical strength (e.g., the material is relatively soft and not puncture resistant). Tougher and less expensive transparent polymers than poly(ethylene-co-tetrafluoroethylene) (ETFE) include aromatic polycarbonates (PC) (e.g., polycarbonate of bisphenol A (BPA)) and poly(ethylene terephthalate) (PET). These polymers can be used at much greater thickness at the same or lower cost than fluoropolymers. Hence, forming an assembly comprising these polymers can reduce cost while enhancing structural integrity. However, these polymers are inherently unstable toward weathering, e.g., these polymers are known to have problems of long term color instability under ultraviolet radiation conditions, resulting in yellowing of the polymer. The yellowing can detract from the polymer's transparency and attractiveness. Loss of gloss and embrittlement can also be undesirable long term phenomena in polymers. A further disadvantage of polymers compared to glass is their lack of hermeticity. Polymeric film typically has a moisture diffusion rate of 1 to 10 grams per square meter per day ($g/m^2/day$) range, which is several orders of magnitude higher than that required to protect some optoelectronic devices.

Figure 4:
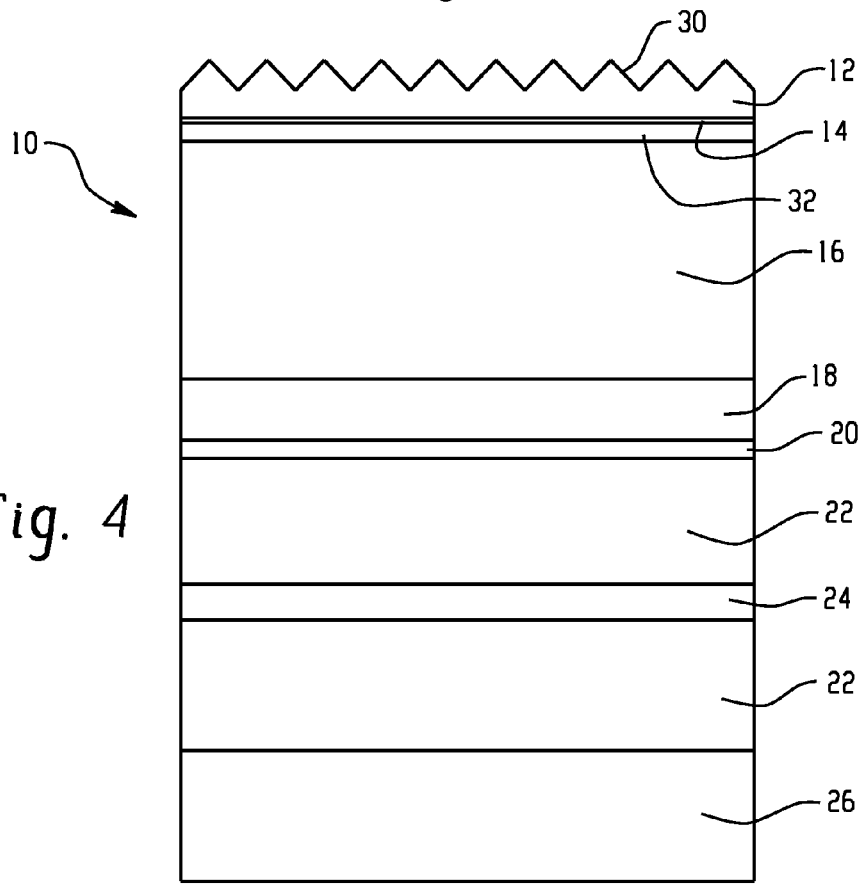
FIG. 4 is a cross-sectional, schematic representation of an exemplary assembly with an optional surface texture.

The optically transparent, weatherable, plastic assembly disclosed herein can protect optoelectronic devices, such as solar cells, in outdoor working environments for periods of greater than or equal to 20 years under extreme weathering conditions and while maintaining high mechanical toughness, in particular, high resistance to puncture and cutting. The assembly is optically transparent and has extreme weatherability, is optionally hermetic, and has a surface toughness to withstand mechanical damage when subjected to a load of greater than 3 pounds as measured by the test specified by UL 1703 Section 24. The assembly comprises a thermoplastic substrate that is mechanically tough and stable in extreme weather conditions. The assembly 10 can comprise: a highly weatherable outer layer (possessing extreme weatherability); gas diffusion barrier coating(s) (e.g., that can reduce permeation of moisture and other gases); a planarization coating(s) (e.g., to smooth the substrate surface); adhesion promotion coating(s) (e.g., to enhance adhesion between elements of assembly); and/or stress balance coating(s) (e.g., to maintain the assembly's geometry (e.g., flat or at certain curvature). The interface between adjacent individual elements of article assembly can be discrete or can have compositional gradient (e.g., the composition can be continuously changing over the interface). An example of the assembly is shown in FIG. 4.

The thermoplastic substrate comprises a polymer that is mechanically tough. Possible materials include bisphenol-A polycarbonate, other aromatic polycarbonates, and polyesters (e.g., poly(ethylene terephthalate) (PET)), as well as combinations comprising at least one of the foregoing materials. The substrate should be transparent (e.g., having a transparency of greater than or equal to 80% as determined using ASTM D1003-00, procedure B using CIE standard illuminant C at wavelengths of 420 nanometers (nm) to 1,200 nm). The substrate can also be of sufficient thickness to prevent mechanical damage of the module; e.g., a combined substrate and weathering layer thickness of greater than or equal to 3 mils (76.2 micrometers (μm)), specifically, greater than or equal to 5 mils (127 μm) thick, including any protective weathering layers.

Weathering stability of tough, aromatic polymers presents a particular challenge. A number of methods are known for imparting weatherability, but currently none is known that will give protection for the desired 20 or more years of service life in a photovoltaic application. The design of the weatherable system must be carefully considered to balance performance and practicality.

The thermoplastic substrate is ultraviolet radiation (UV) protected by: (i) a coating comprising a stable matrix material (also referred to as an extremely weatherable outer layer) and UV absorbers having loss rates of less than or equal to 0.15 absorbance units per year as estimated by xenon arc exposure using the method described in *Journal of Testing and Evaluation*, 32, 240-245 (2004); and/or (ii) a layer (e.g., co-extruded or laminated) comprising a polymer containing ultraviolet absorber(s) such that the rate of erosion is less than or equal to 4 micrometers per year (μm/yr) of exposure as estimated by xenon arc accelerated weathering; and/or (iii) a layer (co-extruded or laminated) comprising a self-protecting polymer such as resorcinol polyarylate having a rate of erosion less than or equal to 4 micrometers per year of exposure as estimated by xenon arc accelerated weathering, and/or (iv) a co-extruded layer comprising both a UV absorber and a block copolymer that comprises resorcinol polyarylate blocks (RPA) and bisphenol-A polycarbonate blocks (PC) where the RPA block content is less than or equal to 40 wt %, specifically less than or equal to 30 wt %, more specifically less than or equal to 20 wt %.

The extremely weatherable outer layer (e.g., coating), which can be applied to the substrate, can comprise a stable coating matrix and stable UV absorber(s). Examples of stable coating matrices are silicones, poly(meth)acrylates, and combinations comprising at least one of the foregoing. Possible UV absorbers include triazines and/or dibenzoylresorcinols. Triazines include:

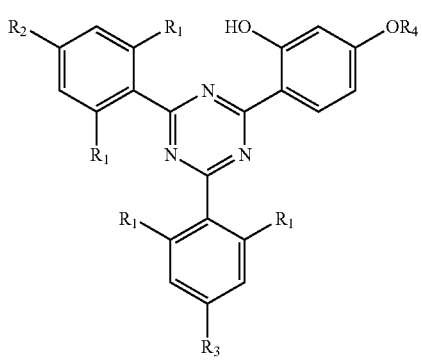

wherein $R_1$=H, $R_2$, $R_3$=independently H, aliphatic $C_1$-$C_{12}$, cycloaliphatic $C_3$-$C_{12}$, or aromatic, $R_4$=H, $C_1$-$C_{24}$ aliphatic, $C_3$-$C_{24}$ cycloaliphatic. Aliphatic and cycloaliphatic groups can also contain alcohol, ether, ester, and carboxylic acid functionality. They can also be linear or branched and may contain silicon. Desirably, $R_1$, $R_2$, and $R_3$=H. Specific examples are $R_1$, $R_2$, $R_3$=H, $R_4$=$C_6H_{13}$ (e.g., Tinuvin® 1577) and $R_1$, $R_2$, $R_3$=H, $R_4$=$CH_2CH_2OOCCH(C_2H_5)$ $CH_2CH_2CH_2CH_3$ (e.g., LA-46).

Possible dibenzoylresorcinols include:

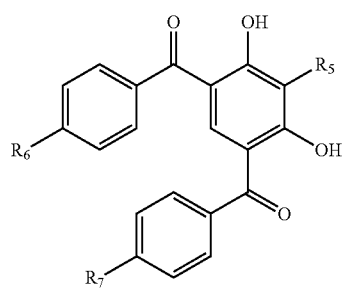

wherein: $R_5$=H, aliphatic $C_1$-$C_{12}$, cycloaliphatic $C_3$-$C_{12}$, $CH_2CH_2CH_2SiR_n(OR_8)_{3-n}$, n=0-2, $R_8$=H, aliphatic $C_1$-$C_{12}$; $R_6$, $R_7$=independently H, aliphatic $C_1$-$C_{12}$, cycloaliphatic $C_3$-$C_{12}$, or aromatic.

Another possible UV absorber is dibenzoylresorcinol:

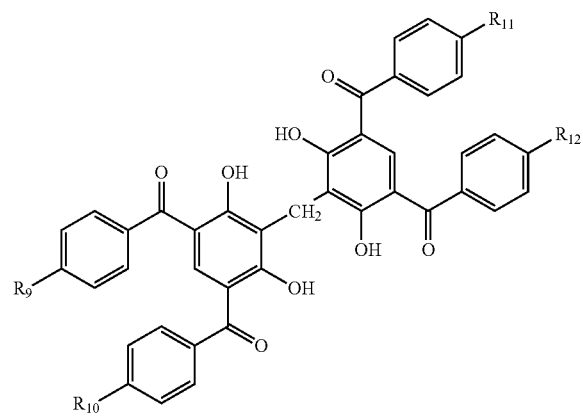

where $R_9$, $R_{10}$, $R_{11}$, $R_{12}$ are independently H, aliphatic $C_1$-$C_{12}$, cycloaliphatic $C_3$-$C_{12}$, or aromatic.

Some specific examples of stable UV absorbers are 4,6-dibenzoylresorcinol, silylated 4,6-dibenzoylresorcinols such as described in U.S. Pat. Nos. 5,391,795 and 5,679,820, and 2,4-diphenyl-6-(2'-hydroxy-4'alkoxyphenyl)-1,3,5-triazines (such as Tinuvin* 1577 commercially available from BASF and ADK STAB LA-46 commercially available from Asahi Denka). A stable UV absorber is characterized by a loss rate of less than 0.15 absorbance units at 330 nm per year of extreme weathering as estimated by exposure to 3 $MJ/m^2$ (measured at 340 nm) of filtered xenon arc accelerated weathering. Mixtures of UV absorbers can be used to improve compatibility. The thickness of the coating is sufficient to have an initial absorbance at 330 nm of greater than or equal to 3 absorbance units, specifically, greater than or equal to 4, e.g., to accommodate the expected loss of absorbance during weathering. The UV absorber(s), if used in the weathering layer, can be present in an amount of greater than or equal to 3 weight percent (wt %), specifically, greater than or equal to 5 wt %, and more specifically, greater than or equal to 7 wt %, yet more specifically, greater than or equal to 10 wt %, based upon a total weight of the coating, e.g., 3 wt % to 8%. In some embodiments, e.g., when used in a co-extruded or laminated layer, the UV absorber(s) are present in an amount greater than or equal to 7 wt %, specifically, 8 wt % to 12 wt %, based upon the total weight of the layer.

The layer of substrate polymer containing UV absorber(s) can be co-extruded, laminated, or otherwise attached to the substrate. The UV absorber has a loss rate less than 0.15 absorbance units per year resulting in an estimated erosion rate of less than 4 micrometers per year (μm/year) as measured by xenon arc accelerated weathering. Exemplary UV absorbers are 2,4-diphenyl-6-(2'-hydroxy-4'alkoxyphenyl)-1,3,5-triazines (such as Tinuvin* 1577 commercially available from BASF Corporation, Florham Park, N.J. 07932 and ADK STAB LA-46 commercially available from Adeka Corporation, Tokyo, Japan), resorcinols (such as 4,6-dibenzoylresorcinols and/or coupled 4,6-dibenzoylresorcinols as described in U.S. Pat. No. 5,763,674), as well as combinations comprising at least one of the foregoing. The UV absorbers can be optionally be present in an amount of greater than or equal to 5 wt %, specifically greater than or equal to 7 wt %, and even more specifically greater than or equal to 8 wt %. This layer can be greater than or equal to 2 mils (50.8 μm) thick, specifically greater than or equal to 3 mils (76.2 μm) thick.

The extremely weatherable outer layer (e.g., self-protecting polymer layer) can comprise the resorcinol polyarylate, which is a polyester derived from resorcinol and a mixture of isophthalic and terephthalic acids. For example, the polyarylate can be a 1,3-dihydroxybenzene isophthalate/terephthalate comprising structural units of the formula:

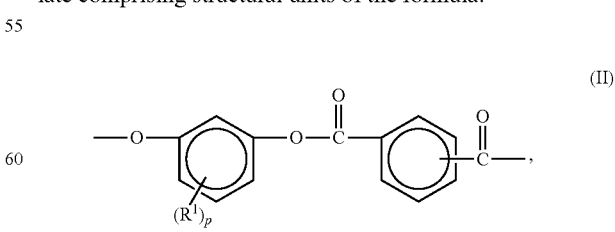

wherein each $R^1$ is a substituent, especially halo or $C_{1-12}$ alkyl, and p is 0-3, optionally in combination with structural units of the formula

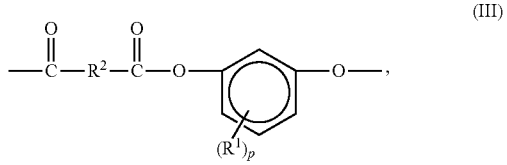

wherein $R^1$ and p are as previously defined and $R^2$ is a divalent $C_{4-12}$ aliphatic, alicyclic or mixed aliphatic-alicyclic radical.

Optionally, other acid groups, such as those derived from aliphatic dicarboxylic acids such as succinic acid, adipic acid or cyclohexane-1,4-dicarboxylic acid, or from other aromatic dicarboxylic acids such as 1,8-naphthalenedicarboxylic acid, can be present in the coating layer. These can be present in amounts no greater than or equal to 30 mole percent. It is possible to include other polyesters which are miscible in at least some proportions with the polyarylate, such polymers are exemplified by poly(butylene terephthalate) (PBT), polyethylene terephthalate) (PET), poly(trimethylene terephthalate) (PTT), and poly(1,4-cyclohexylidene cyclohexane-1,4-dicarboxylate) (PCCD). The coating layer polymer can consist of units of formula II, optionally in combination with units of formula III.

The units of formula II contain a resorcinol or substituted resorcinol moiety in which any $R^1$ groups can be $C_{1-4}$ alkyl; i.e., methyl, ethyl, propyl or butyl. In one embodiment $R^1$ groups are primary or secondary groups. In a particular embodiment $R^1$ groups are methyl. In some embodiments p is zero, although moieties in which p is 1 are possible. Said resorcinol moieties are most often bound to isophthalate and/or terephthalate moieties.

In the optional soft block units of formula III, resorcinol or substituted resorcinol moieties are again present in esterforming combination with $R^2$ which is a divalent $C_{4-12}$ aliphatic, alicyclic or mixed aliphatic-alicyclic radical. In some embodiments $R^2$ is aliphatic and especially $C_{8-12}$ straight chain aliphatic.

The resorcinol polyarylate can be a block copolymer with BPA polycarbonate comprising the other blocks as described in U.S. Pat. Nos. 6,559,270, 6,572,956, 6,607,814, and 6,610,409. An example of a resorcinol polyarylate is Lexan* SLX (commercially available from SABIC Innovative Plastics, Pittsfield, Mass.). In some embodiments, the block copolymers, the resorcinol polyarylate content can be greater than or equal to 50 wt %, specifically, greater than or equal to 80 wt %, with the remainder being blocks of bisphenol A polycarbonate. In such an embodiment, the weathering layer can be free of additional UV absorbers. In other embodiments, the resorcinol polyarylate block content is less than or equal to 40 wt %, specifically less than or equal to 30 wt %, more specifically less than or equal to 20 wt %, wherein an additional UV absorber is employed, such as triazine and/or benzotriazole. The layer of resorcinol polyarylate can be applied, for example, by co-extrusion, coating, or lamination. Tie-layer(s), e.g., of other materials such as aliphatic polyurethane and/or poly(ethylene-co-vinyl acetate), can be used between the resorcinol polyarylate and the substrate to improve adhesion. The layer of resorcinol polyarylate can be greater than or equal to 2 mils (50.8 μm) thick, specifically, greater than or equal to 3 mils (76.2 μm) thick, e.g., to accommodate the erosion expected during weathering.

The thermoplastic substrate can be formed from a polycarbonate composition in order to achieve desired physical properties such as cut resistance and toughness against potential physical damage of the optoelectronic device(s). For PV module applications, the thermoplastic substrate (with the protective weathering layer) can be bonded to the cell adhesive (also referred to as encapsulant) layer(s), such as EVA (ethylene vinyl acetate) sheets, e.g., through a thermal lamination process or another process. When using a lamination process, the lamination temperature for solar encapsulant EVA sheets can be 140° C. to 150° C., e.g., in order for EVA to substantially crosslink and achieve good mechanical properties.

The thermal shrinkage of the substrate at 150° C. should be small (preferably less than 1%) to avoid disruption of cell-to cell spacing in the module and also minimize the thermally induced mechanical stress of the substrate layer onto the tabbing wires that connect cells. Hence, it is beneficial if the polycarbonate composition forming the substrate has a glass transition temperature (Tg) greater than or equal to 155° C. The examples of polycarbonate compositions include, but not limited to, the compositions comprising at least a bisphenol-A polycarbonate homopolymer and a polycarbonate copolymer. The polycarbonate copolymer can be: tetrabromobisphenol A (TBBPA) carbonate and BPA carbonate; a copolymer of 2-phenyl-3,3-bis(4-hydroxyphenyl) phthalimidine (p,p-PPPBP) carbonate and BPA carbonate; a copolymer of 4,4'-(1-phenylethylidene)biphenol (Bisphenol-AP) carbonate and BPA carbonate; a copolymer of 4,4'-(1-methylethylidene)bis[2,6-dimethyl-phenol] (tetramethyl BPA or TMBPA) carbonate and BPA carbonate; and combinations comprising at least one of the foregoing. The polycarbonate compositions comprising TBBPA are brominated polymers that also have good flame retardance, which is desirable for protecting optoelectronic devices.

The structure of the copolymer of TBBPA carbonate and BPA carbonate is illustrated by the following formula:

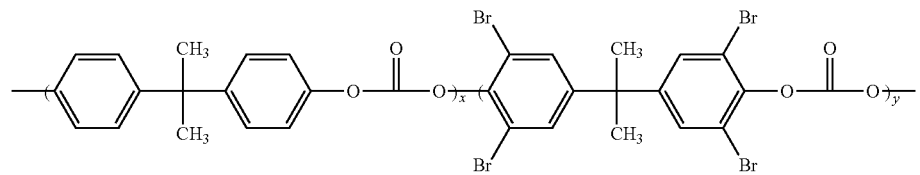

The structure of the copolymer of p,p-PPPBP carbonate and BPA carbonate is illustrated by the following formula:

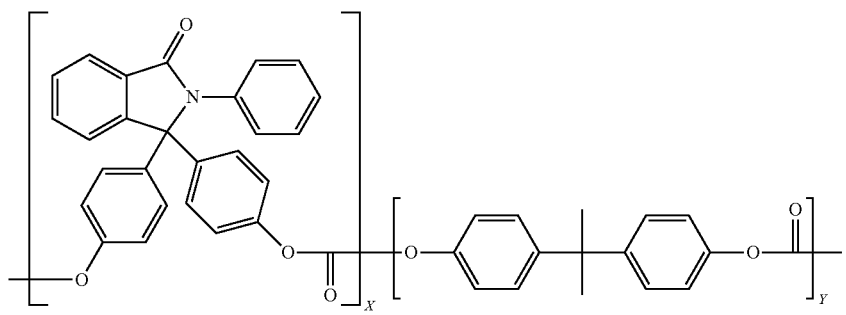

The structure of the copolymer of Bisphenol-AP carbonate and BPA carbonate is illustrated by the following formula:

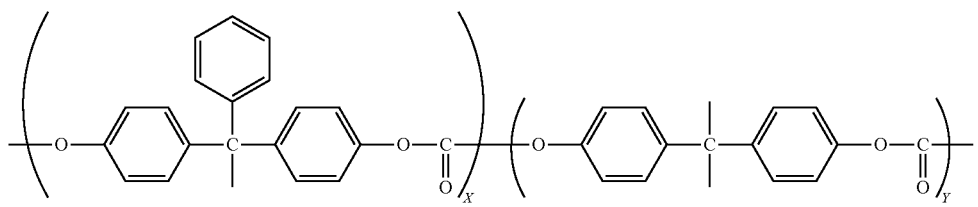

The structure of the copolymer of TMBPA carbonate and BPA carbonate is illustrated by the following formula:

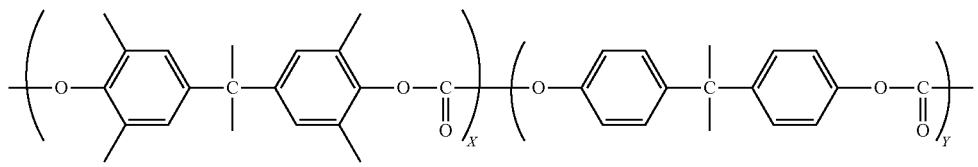

Optionally, the surface of the substrate layer facing to the protected optoelectronic devices can be a non-flat surface. For photovoltaic (PV) module applications, it is advantageous to have a matte finish on the solar cell side surface of the substrate layer to reduce the chance of air entrapment between the substrate layer and the cell encapsulant sheet (e.g., EVA sheet) during the module lamination process.

Optionally, the air side surface of protective weathering layer has an engineered surface texture. When the protective weathering layer and the underneath substrate layer is used as the front sheet of a PV module, the engineered surface texture on the air side of the front sheet can enhance the transmission of solar light through the front sheet into the solar cells, hence increasing the power output of the PV module. Engineered surface textures that can achieve this function include, but are not limited to, surface textures comprising a plurality of lenses, microlenses, linear prisms, prisms, pyramids, lenticular structures, as well as combinations comprising at least one of the foregoing. The film layer with an engineered surface texture can be made via several methods such as those described in U.S. Pat. No. 4,280,978, U.S. Pat. No. 7,092,163, and U.S. Patent Publication No. 2003/0108710. These methods include a hot-embossing or stamping process, a melt calendaring extrusion process, an injection molding process, or a micro-replication coating process using radiation-curable coating material. The particular method of making a surface textured plastic sheet is not limited, and is a matter of choice based on economics, availability, and additional application requirements.

Optionally, the article can comprise planarizing layer(s) and/or organic-inorganic composition barrier coating layer(s). The barrier coating (which can be graded or non-graded) can comprise at least one zone substantially organic in composition and at least one zone substantially inorganic in composition. For example, barrier coating can comprise at least one zone being greater than or equal to 75 wt % organic in composition (based upon the total weight of that zone) and at least one zone being greater than or equal to 75 wt % inorganic in composition (based upon the total weight of that zone), and specifically, the barrier coating can comprise at least one zone being greater than or equal to 85 wt % organic in composition (based upon the total weight of that zone) and at least one zone being greater than or equal to 85 wt % inorganic in composition (based upon the total weight of that zone). Some examples of organic-inorganic composition barrier coatings are described in reference U.S. Pat. No. 7,449, 246. Exemplary coating compositions for the organic-inorganic barrier layer, are organic, ceramic and/or inorganic materials, as well as combinations comprising at least one of the foregoing. These materials can be reaction or recombination products of reacting plasma species and are deposited onto the substrate surface. Organic coating materials typically comprise carbon, hydrogen, oxygen, and optionally other elements, such as sulfur, nitrogen, silicon, etc., depending on the types of reactants. Examples of reactants that result in organic compositions in the coating are straight or branched alkanes, alkenes, alkynes, alcohols, aldehydes, ethers, alkylene oxides, aromatics, silicones, etc., having up to 15 carbon atoms. Inorganic and ceramic coating materials typically comprise oxide; nitride; carbide; boride; or combinations comprising at least one of the foregoing of elements of Groups IIA, MA, IVA, VA, VIA, VIIA, IB, and IIB; metals of Groups IIIB, IVB, and VB; and rare-earth metals. For example, the barrier coating can have optical properties that are substantially uniform along an axis of light transmission, said axis oriented substantially perpendicular to the surface of the coating.

For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. A graded composition of the coating is obtained by changing the compositions of the reactants fed into the reactor chamber during the deposition of reaction products to form the coating.

The barrier coating can have a transmission rate of oxygen through the barrier coating of less than or equal to 0.1 cubic centimeters per square meter-day ($cm^3/(m^2\ day)$), as measured at 25° C. with a gas containing 21 vol % oxygen. The water vapor transmission can be less than about 0.01 grams per square meter-day ($g/(m^2\ day)$), as measured at 25° C. and with a gas having 100% relative humidity.

Barrier layer(s) can be applied to polymer films by various methods such as chemical vapor deposition (e.g., plasma-enhanced chemical-vapor deposition, radio-frequency plasma-enhanced chemical-vapor deposition, expanding thermal-plasma chemical-vapor deposition, electron-cyclotron-resonance plasma-enhanced chemical-vapor deposition, and inductively-coupled plasma-enhanced chemical-vapor deposition), sputtering (e.g., reactive sputtering), and so forth, as well as combinations comprising at least one of the foregoing. Some such methods are described in U.S. Pat. No. 7,015,640 and U.S. Patent Publication No. 2006/0001040.

The planarizing layer can comprise a resin such as an epoxy based resin (cycloaliphatic resin), an acrylic based resin, a silicone resin, as well as combinations comprising at least one of the foregoing. One example of a planarizing layer is a UV-cured acrylic-colloidal silica coating such as the Lexan* HP-H UV-cured acrylic-colloidal silica coating commercially available from the Specialty Film and Sheet business unit of SABIC Innovative Plastics. The planarizing layer, and/or other coatings, can further include additive(s) such as flexibilizing agent(s), adhesion promoter(s), surfactant(s), catalyst(s), as well as combinations comprising at least one of the foregoing. In some embodiments, the planarizing layer thickness can be 1 nanometer (nm) to 100 micrometers (m). Often the planarizing layer thickness can be 100 nm to 10 μm, specifically, 500 nm to 5 μm.

The planarizing layer can be substantially smooth and substantially defect free. The term "average surface roughness" $R_a$ is defined as the integral of the absolute value of the roughness profile measured over an evaluation length. The term "peak surface roughness" $R_p$ is the height of the highest peak in the roughness profile over the evaluation length. The term "substantially smooth" means the average surface roughness $R_a$ is less than or equal to 4 nm, specifically, less than or equal to 2 nm, and more specifically, less than or equal to 0.75 nm. The peak surface roughness $R_p$ can be less than or equal to 10 nm, specifically less than or equal to 7 nm, and more specifically, less than or equal to 5.5 nm. Substantially defect free means the number of point defects is less than or equal to 100 per square millimeter ($mm^2$), specifically, less than or equal to $10/mm^2$, and more specifically, $1/mm^2$.

The coated substrate can have a low permeability of oxygen, water vapor and other reactive materials present in the environment. By low permeability it is meant that the oxygen permeability is less than or equal to 0.1 $cm^3/(m^2\ day)$, as measured at 25° C., and with a gas containing 21 volume-percent (vol %) oxygen. The water vapor transmission rate can be less than or equal to $1 \times 10^{-2}$ grams per square meter day ($g/(m^2\ day)$), as measured at 25° C. with a gas having 100% relative humidity. The coated substrate can have an average light transmittance greater than or equal to 85% in a wavelength range of 420 nanometers to 700 nanometers.

Often, a planarizing and/or adhesion promoting layer is applied to one side of the substrate before application of the barrier layer(s).

The coated substrate can be employed to protect an optoelectronic device, such as a photovoltaic (PV) cell. Examples of PV cells are single crystal silicon, polycrystalline silicon, amorphous silicon, silicon tandem cells, copper indium gallium selenide (CIGS), cadmium telluride (CdTe), and organic cells, as well as combinations comprising at least one of the foregoing. The various types of cells have different demands for moisture protection varying from protection against only liquid water to highly effective protection from water vapor making the moisture barrier optional. Some PV cells can be applied to relatively thin, flexible substrates, such as stainless steel foil or polymer films.

Typically, a PV module comprises a glazing layer, an encapsulant, the interconnected PV cells, another layer of the same or a different encapsulant, and a backing material. The encapsulants are often curable materials such as poly(ethylene vinyl acetate) (EVA), silicones, thermoplastic materials (such as aliphatic polyurethanes and/or polyolefin ionomers), and combinations comprising at least one of the foregoing. They are selected on the basis of clarity, adhesion, and mechanical protection provided to the PV cell. The backing material is selected according to the application. For example, flexible PV modules can use a polymer film backing while crystalline silicon cells can use a rigid backing. The essential criterion is that the backing has good adhesion to the selected encapsulant.

As is illustrated in FIG. 4, the assembly can comprise an adhesive layer (encapsulant) 22 on one or both sides of the optoelectronic device 24. For example, the adhesive layer(s) 22 can be in physical contact with the optoelectronic device 24. The weathering layer 12 can be located on one side of the optoelectronic device 24, on the side to be directly exposed to the weathering conditions. This weathering layer 12 can be the outermost layer (e.g., not covered by another layer). Between the weathering layer 12 and the optoelectronic device 24 is the substrate 16. Between the substrate 16 and the optoelectronic device 24 can be optional leveling layer(s) 18, optional oxygen/moisture barrier layer(s) 20, and optionally the adhesive layer 22. Between the weathering layer 12 and the substrate 16 can be primer layer(s) 14. On the side of the optoelectronic device 24 that is opposite the weathering layer 12 is a backing sheet 26 with an optional adhesive layer 22 between the backing sheet 26 and the optoelectronic device (e.g., an elecctroactive device) 24.

A photovoltaic cell can be formed of layers of p-i-n semi-conductive material. Optionally, each layer of which can, in turn, be formed of, a semiconductor alloy material (e.g., a thin film of such alloy material).

In one embodiment, a p-i-n type photovoltaic device, such as a solar cell, can comprise individual p-i-n type cells. Below the lowermost cell can be a substrate (e.g., a transparent substrate) or a substrate comprising a metallic material such as stainless steel, aluminum, tantalum, molybdenum, chrome, or metallic particles embedded within an insulator (cermets). In some applications there is a thin oxide layer and/or a series of base contacts prior to the deposition of the amorphous semiconductor alloy material.

Each of the cells can be fabricated from a body of thin film semiconductor alloy material comprising silicon and hydrogen. Each of the bodies of semiconductor alloy material includes an n-type layer of semiconductor alloy material; a substantially intrinsic layer of semiconductor alloy material; and a p-type layer of semiconductor alloy material. The intrinsic layer can include traces of n-type or p-type dopant material without forfeiting its characteristic neutrality, hence it may be referred to as a "substantially intrinsic layer".

Also, although p-i-n type photovoltaic cells are depicted, the methods and materials can also be used to produce single or multiple n-i-p type solar cells, p-n type cells or devices, Schottky barrier devices, as well as other semiconductor elements and/or devices such as diodes, memory arrays, photoresistors, photodetectors, transistors, etc. The term "p-i-n type", as used herein, is defined to include any aggregation of n, i, and p layers operatively disposed to provide a photoresponsive region for generating charge carriers in response to absorption of photons of incident radiation.

The following examples are merely illustrative of the device disclosed herein and are not intended to limit the scope hereof.

EXAMPLES

Example 1

Puncture Resistance Comparisons

One measure of puncture resistance is supporting the polymer film on an encapsulant film and impacting with a punch as shown in FIG. 1. Thus, a 4 pound (1.8 kg) weight was dropped from various heights onto a flat, 0.19 inch (0.48 cm) square steel punch. Failure is defined as a break in the polymer film. Films of 5 mil (127 μm) thickness were supported on a polyurethane encapsulant film 14 mils (355.6 μm) thick supplied by Stevens Urethane. The forces were applied to films of an ETFE polymer (commercially available from 3M Company), a PC film (Lexan* 8050 film, commercially available from SABIC Innovative Plastics IP B.V.), and a PET film (commercially available from DuPont-Teijen) are shown in Table 1. The results show that PC and PET can withstand greater penetrating forces than ETFE at equivalent thicknesses.

TABLE 1

| Force inch-lb (kg-cm) | Penetration | | |
|---|---|---|---|
| | ETFE | PC | PET |
| 20 (23) | pass | pass | pass |
| 40 (46) | pass | pass | pass |
| 60 (69) | pass | pass | pass |
| 80 (92) | fail | pass | pass |

Example 2

Cut Test Results

Figure 2:
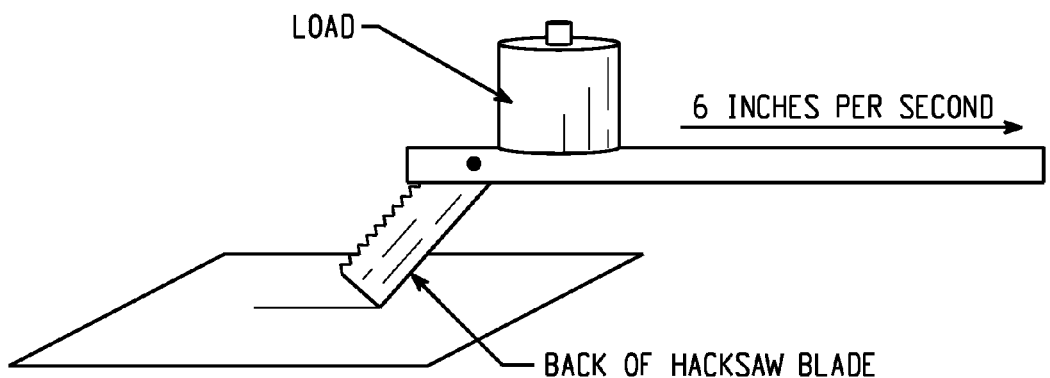
FIG. 2 is a schematic representation of a cut test.

A measure of cut resistance is provided by Underwriters Laboratories UL1703 section 24 in which a weighted carbon steel blade is drawn across the polymer film as is shown schematically in FIG. 2. The load is measured at the blade tip. Films were vacuum laminated to poly(ethylene-co-vinyl acetate) (EVA) or polyurethane encapsulant films to simulate modules. For comparison, a portion of a flexible Uni-Solar Photovoltaic Laminate was also tested. To determine whether the film was cut through, a solution of 1 milligram (mg) of fluorescein dye in 1 milliliter (mL) of 95% ethanol was applied to the area and allowed to dry. Excess fluorescein was removed by running water and the area was examined under a 365 nanometers (nm) blacklight. Any penetration of the solution through the film resulted in fluorescein diffusing into the encapsulant resulting in intensely fluorescent zones. Results are shown in Table 2.

TABLE 2

| | load (pounds) | | | | |
|---|---|---|---|---|---|
| Sample | 2 | 3 | 4 | 5 | 6 |
| Unisolar module (2 mil (50.8 μm) ETFE/EVA-glass) | OK | cut | | | |
| 5 mil (127 μm) ETFE/EVA encapsulant | OK | OK | OK | cut | |
| 2.5 mil (63.5 μm) PC/EVA encapsulant | OK | OK | cut | | |
| 5 mil (127 μm) PC/polyurethane encapsulant | OK | OK | OK | OK | cut |
| 12 mil (304.8 μm) co-extruded PC film/polyurethane encapsulant | OK | OK | OK | OK | OK |

A commercially-available flexible amorphous silicon module from Uni-Solar, consisting of approximately 2 mil (50.8 μm) ETFE and glass-filled EVA encapsulant as described in U.S. Pat. No. 5,474,620 showed cut-through with a 3-pound (1.4 kg) load. PC of similar thickness with an unfilled encapsulant showed cut-through with a 4-pound (1.8 kg) load. ETFE at 5 mils (127 μm) with an unfilled encapsulant cut through at 5-pounds (2.3 kg) while 5 mil (127 μm) PC cut through at 6 pounds (2.7 kg). Thicker 8 mil (200 μm) PC with a 4 mil (100 μm) co-extruded protective weatherable layer showed no cut-through even with a 6 pound (2.7 kilogram (kg)) load. This example shows that PC films are more resistant to cutting than ETFE.

Example 3

UV Stability

Several methods exist to improve the weathering resistance of polymers such as PC and PET. For example, coatings containing ultraviolet absorbing agents (UVA) can be applied. However, it is difficult to achieve the desired greater than 20 years weathering because the UVA itself is susceptible to photodegradation. The lifetime of a transparent coating ultimately is determined by the lifetime of the UV absorber and the stability of the matrix. One is often limited by the maximum thickness and maximum UVA loading allowed for the coating before physical properties are compromised.

The rates of UV absorber loss are determined in the coating of interest because the rates often are dependent on the matrix. The coatings are exposed to filtered xenon arc weathering using daylight filters as defined in ASTM G-155. Loss rates of representative UV absorbers in PMMA are shown in Table 3 by the method described in *Journal of Testing and Evaluation*, 32(3), 240-245 (2004). It has been found that loss rate varies considerably even among absorbers of the same general class. Coatings containing triazines with no methyl groups on the aromatic rings, and benzophenones bearing the 4,6-dibenzoylresorcinol moiety, are particularly desirable, as well as combinations comprising at least one of the foregoing. Exemplary triazines include Tinuvin* 1577 (commercially available from BASF) and LA-46 (commercially available from Adeka Corporation).

Desirably, UV absorber has a loss rate of less than 0.1 A/MJ/m$^2$, specifically, less than or equal to 0.05 A/MJ/m$^2$, as measured at 340 nm of filtered xenon arc exposure. With a correlation of approximately 3 MJ/m$^2$ being equivalent to one year of extreme weathering, this would give a loss rate less than or equal to 0.15 A/year.

TABLE 3

| Absorber | UVA type | loss rate (A/MJ/m$^2$ exposure)* |
|---|---|---|
| Cyasorb* 531 | benzophenone | 0.18 |
| Uvinul* 3039 | cyanoacrylate | 0.14 |
| Cyasorb* 5411 | benzotriazole | 0.11 |
| Tinuvin* 360 | benzotriazole | 0.15 |
| Cyasorb* 1164 | triazine | 0.085 |
| Tinuvin* 1577 | triazine | 0.02 |
| Adeka LA-46 | triazine | 0.02 |
| 4,6-dibenzoylresorcinol (DBR) | benzophenone | 0.03 |

*A/MJ/m$^2$ exposure = absorption units at 330 nm per megajoule per meter squared.

Example 4

Coating Solutions with Benzotriazole UV Absorbers

A coating solution was prepared containing 7 grams (g) of Elvacite 2041 PMMA, 79 g of 1-methoxy-2-propanol, 14 g of diacetone alcohol, 0.85 g of Tinuvin 384, 0.43 g of Tinuvin 328, 0.22 g of Cyasorb 5411, and 2 drops of BYK 331 surfactant. Thus, the solution contains 7% PMMA by total weight and 10% Tinuvin 384, 5% Tinuvin 328, and 2.5% Cyasorb 5411 based on solids. This solution was applied by flow coating onto 7 mil (177.8 µm) polycarbonate films 10 inches (25.4 cm) wide and 15 inches (38.1 cm) long, the solvent was flashed at 50° C. for 10 minutes, and the coated film was baked for 1 hour at 100° C. The top 5 inches (12.7 cm) of the films was discarded.

Example 5

Coating Solutions with Dibenzoylresorcinol and Diphenyltriazine UV Absorbers A coating solution was prepared containing 14 g of Elvacite 2041 PMMA, 158 g of 1-methoxy-2-propanol, 28 g of diacetone alcohol, 1.7 g of 4,6-dibenzoylresorcinol (DBR), 0.85 g of Adeka LA-46, 0.43 g of Tinvuin 1577, and four drops of BYK 331 surfactant. Thus, the solution contains 7% PMMA by total weight and 10% DBR, 5% LA-46, and 2.5% of Tinuvin 1577 based on solids. This solution was applied by flow coating onto 7 mil (177.8 µm) polycarbonate films 10 inches (25.4 cm) wide and 15 inches (38.1 cm) long, the solvent was flashed at 50° C. for 10 minutes, and the coated film was baked for 1 hour at 100° C. The top 5 inches (12.7 cm) of the films was discarded.

Example 6

Weathering of Encapsulated Cells

Packaging of CIGS solar cells (Global Solar Energy, Tuscon, Ariz.) consists of the following laminate stack-up: backsheet/encapsulant/solar cell/encapsulant/top-sheet. The laminate structure is placed in a small vacuum laminator set to 150° C. The stack-up is placed in the laminator under vacuum for five minutes. During this de-gassing step, parts reach approximately 90° C. After five minutes, pressure is applied to the laminate and the part is held at temperature for eleven minutes. Following the lamination step, the part is removed and lamination is complete.

Weathering conditions: Samples were weathered in an Atlas Ci5000 xenon arc Weather-ometer* using a Rightlight* inner filter and a CIRA quartz outer filter on the lamp with a cycle of 160 minutes light and 20 minutes light with water spray. The settings during the light period were irradiance 0.80 W/m$^2$/nm at 340 nm, 65° C. black panel, 45° C. chamber air, and 50% relative humidity. During the water spray, the settings were irradiance 0.80 W/m$^2$/nm at 340 nm, 35° C. black panel, 25° C. chamber air, and 100% relative humidity. Exposure was measured as MJ/m$^2$/nm at 340 nm. The samples were mounted on holders offset 6 inches (15.2 cm) toward the lamp making the irradiance incident on the samples 1.9× the measured amount and increasing the black panel temperature to 75° C.

Figure 3:
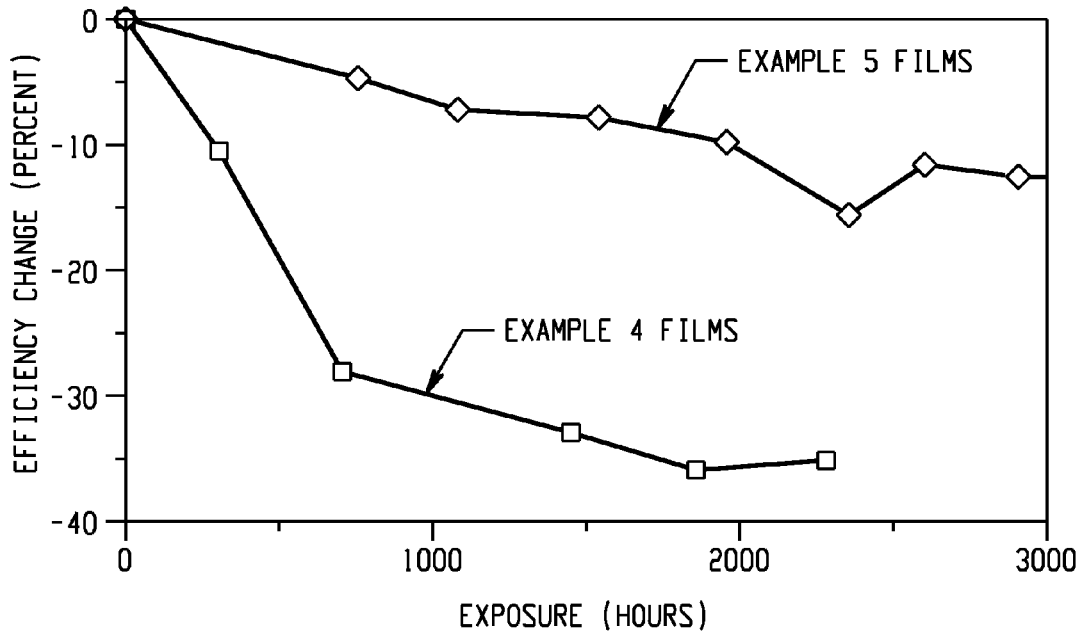
FIG. 3 is a graphical representation of efficiency change (%) versus exposure (hr).

Encapsulated CIGS cells were exposed in triplicate and removed periodically for efficiency measurements. After 4,253 hours of weathering exposure, the cells encapsulated using the benzotriazole coatings of Example 4 were rough and pitted and exhibited a decrease in efficiency of 65% relative to their initial efficiency of 12.2%. By contrast, after 4,837 hours of exposure the cells encapsulated using the coating containing more stable UV absorbers of Example 5 appeared unchanged and showed a decrease in efficiency of only 16.2% relative to their initial efficiency of 11.7%. A graph of the results is shown in FIG. 3. This shows that the particular UV absorber is important for long-term weathering performance and that the selection of UV absorber having long-term weatherability is not inherent and is not obvious.

Example 7

Co-Extruded PC Films

A second method of protection is use of a co-extruded cap layer of a polymer containing a relatively high loading of UV absorber. Co-extrusion of a thin layer of highly stabilized PC and a thicker PC substrate is well-established technology. Current commercial products use benzotriazole or cyanoacrylate-type UV absorbers in 5-10% loading in a 2 to 5 mil (50.8 to 127 μm) cap layer. These absorbers are not very photostable and result in fairly fast erosion over the course of 7 to 10 years outdoors.

Co-extruded PC films comprising 8 mils (203 μm) of base resin and 4 mils (102 μm) of cap resin were prepared with the compositions of the cap resins shown in Table 4. These films were painted black on the back sides, partially masked with removable black aluminum strip, and subjected to weathering under the conditions described in Example 5. The samples were removed periodically, the mask was removed, and the amount of erosion was determined using a Dektak II stylus profilometer. The erosion rates are shown in Table 4. Tinuvin 360 is a high molecular weight benzotriazole used in co-extruded products. The 4,6-diphenyltriazines clearly give superior performance. In this test, one year of Florida weathering is simulated by approximately 3 megajoules/m$^2$ (MJ/m$^2$) of xenon arc exposure measured at 340 nm. At 7.4 wt % loading or greater of Tinuvin 1577 or 9.1 wt % or greater of LA-46, we expect about 3 micrometers per year (μm/yr) of erosion so that a 4 mil (102 μm) cap layer would be expected to weather for greater than 25 years. By contrast, cap layer employing the benzotriazole UV absorber (run 2) will be exhausted after 17 years.

TABLE 4

Erosion rates for co-extruded films during xenon arc exposure

| run # | cap resin composition | UVA type | Erosion rate (μm/MJ/m$^2$) |
|---|---|---|---|
| 1 | Control (no UVA) | — | 6.1 |
| 2 | Tinuvin 360 6.5 wt % | benzotriazole | 2.2 |
| 3 | Tinuvin 1577 3.8 wt % | diphenyltriazine | 2.4 |
| 4 | Tinuvin 1577 5.7 wt % | diphenyltriazine | 1.7 |
| 5 | Tinuvin 1577 7.4 wt % | diphenyltriazine | 1.3 |
| 6 | LA-46 5.7 wt % | diphenyltriazine | 2.1 |
| 7 | LA-46 7.4 wt % | diphenyltriazine | 1.6 |
| 8 | LA-46 9.1 wt % | diphenyltriazine | 1.1 |

Diphenyltriazine-type UV absorbers are more photostable and are therefore useful with polycarbonate. Diphenyltriazine-type UV absorbers are particularly useful at concentrations of greater than or equal to 4 wt %, specifically, greater than or equal to 5 wt %, and more specifically, greater than or equal to 6 wt %, based upon a total weight of the protective weathering layer. More specifically, the diphenyltriazine-type UV absorbers can be used in an amount of 5 wt % to 12 wt %. These absorbers are characterized as having a loss rate of less than 0.05 absorbance units per megajoule per meter squared (A/MJ/m$^2$) of xenon arc exposure as compared to greater than 0.1 A/MJ/m$^2$ for the more conventional absorbers.

A third method of improving weathering is use of a highly weatherable, UV blocking polymer, e.g., resorcinol polyarylate (RPA, also known as ITR or Lexan SLX™) When exposed to sunlight, the RPA undergoes a rearrangement to a 2-hydroxybenzophenone that acts as a UV absorber. This is not stable indefinitely and the material erodes at a rate of less than or equal to 3 μm/yr. The RPA can be a block copolymer of RPA and PC. Desirably, the RPA content of the block copolymer can be 50 wt % to 95 wt %, specifically, 80 wt % to 90 wt %.

In various embodiments, RPA-PC layer can also be laminated onto PET substrate, e.g., using an adhesive such as thermoplastic polyurethane or acrylic based adhesive during a lamination process.

Example 8

Weathering of RPA Laminates Based on High RPA Content RPA-PC Layer

A 5 mil (127 μm) thick extruded film of 90:10 RPA:PC (based on weight) block copolymer was vacuum laminated onto Melinex 725 PET film (from DuPont-Teijin) using an approximately 7 mil (177.8 μm) thick thermoplastic polyurethane film (from Bayer) as the adhesive. The back of the sample was painted black. The samples were subjected to accelerated weathering using the conditions in Example 6. After 49 megaJoules per square meter (MJ/m$^2$) of exposure (measured at 340 nm), the films were fully transparent and ductile when folded. Non-laminated films became yellowed and brittle after 4 MJ/m$^2$ of exposure (measured at 340 nm). Resorcinol polyarylates have been reported to have erosion rates less than or equal to 3 μm/year as estimated from filtered xenon arc weathering in *Polymer Preprints* 48(1), 643-644, (2007).

Example 9

Moisture Barriers

Five-zone graded barrier coatings were applied using methods described in U.S. Pat. No. 7,015,640, to the backs of polymer that had the coatings described in Example 5 applied to the front sides.

The graded-composition coating having a thickness of about 500 nm was formed using the radio-frequency plasma-enhanced chemical vapor deposition (RFPECVD) technique. Silane (maximum flow rate of about 500 standard cm$^3$/minute), ammonia (maximum flow rate of about 60 standard cm$^3$/minute), and organic precursor (maximum flow rate of about 500 standard cm$^3$/minute) were used to produce the graded coating comprising silicon, carbon, oxygen, and nitrogen. The rates of the reactant gases were varied during deposition so that the composition of the coating varied continuously across its thickness. The power fed to the RF electrode was about 100 watts (W) when plasma was generated from the organic precursor, and about 200 W when a mixture of silane and ammonia was fed into the reactor. The vacuum level in the reactor was about 0.2 mm Hg and the average temperature was about 55° C.

These coated films were used to vacuum encapsulate CIGS photovoltaic cells (Global Solar Energy, Tuscon, Ariz.) using 0.5 inches (1.27 cm) Truseal edge tapes (Truseal Technologies, Solon, Ohio), thermoplastic polyurethane encapsulant and glass on the back side. Triplicate cells were then subjected to damp heat testing at 85° C. and 85% relative humidity. Compositions and results are shown in Table 5. The HP-H leveling layer is an abrasion resistant UV-cured coated film from SABIC Innovative Plastics. Excellent retention of cell efficiency was obtained when a graded barrier was applied to the UV-protected polymer films. The cells of Run 3 were subsequently placed under the accelerated weathering conditions described in Example 6. After 4,115 hours of exposure, one cell failed by delamination, but the other two cells had retained 88% of their initial efficiency, losing only 3% during weathering. This example shows that effective moisture barriers can be applied to UV-protected PC and PET films.

TABLE 5

Table 5: Efficiency retention after 1010 hours damp heat testing. Average of three cells.

| Run # | base film | leveling layer | barrier | % of initial efficiency |
|---|---|---|---|---|
| 1 | 7 mil (177.8 μm) PC | none | none | 23 |
| 2 | 7 mil (177.8 μm) PC | none | 5-zone | 97.3 |
| 3 | 15 mil (381 μm) PC | HP-H | 5-zone | 90.6 |
| 4 | 7 mil (177.8 μm) Melinex 725 PET | none | 5-zone | 95.4 |

Example 10

Encapsulation Using Co-Extruded PC

Polycrystalline silicon photovoltaic cells were vacuum encapsulated using co-extruded films of runs 5 and 8 of Example 7 on the front, EVA encapsulant, and ⅛ inch (0.32 centimeters (cm)) thick BPA polycarbonate sheet on the back.

Seven of these cells, having an average initial efficiency of 14.3%, were subjected to accelerated weathering conditions of Example 6. After 17.5 MJ/m$^2$ at 340 nm exposure (3,200 hours; equivalent to 5.8 years of Florida weathering), the cells had an average efficiency of 13.6%, indicating a relative loss of 4.9% efficiency. Exclusion of one poor cell gave an average efficiency of 13.8% for the other six, indicating a relative loss of 3.5% efficiency. Both are within the 1% loss per year generally considered tolerable.

Example 11

Co-Extruded ("Coex") PC Films with a Cap Layer Comprising 20:80 RPA:PC (Based on Weight) Copolymer and a UV Absorber It is noted that the RPA-PC block copolymer can be co-extruded with a polycarbonate substrate to make a film or sheet. However, when the RPA content of the block copolymer is greater than or equal to 50 wt % based upon the total weight of the block copolymer, the copolymer is incompatible with regular BPA polycarbonate substrate so that a tie layer is required between the RPA-PC copolymer layer and the BPA-PC substrate layer for the co-extrusion process. When the RPA content of the block copolymer is less than or equal to 40 wt % based upon the total weight of the block copolymer, the block copolymer is compatible with BPA-PC and can be directly co-extruded with the BPA-PC substrate layer without a tie layer (e.g., can be free of an adhesive layer between the RPA-PC block copolymer layer and the substrate). As noted above, UV absorber(s) can be added into the weathering layer composition to further enhance the UV resistance of the layer. Layers can have a thickness of 3 to 10 mils (76.2 to 254 μm) of RPA-PC block copolymer and 5 to 20 mils (127 μm to 508 μm) of substrate (e.g., polycarbonate). Most particularly is 4 to 5 mils (101.6 μm to 127 μm) of RPA-PC block copolymer and 5 μm to 15 mils (127 μm to 381 μm) of substrate (e.g., polycarbonate).

For each sample condition of this co-extruded PC film series, a 4 mil (100 μm) thick cap layer comprising a UV absorber was directly co-extruded with a 10 mil (250 μm) thick substrate (e.g., base layer) without need of a tie layer (i.e., adhesive layer). The compositions of both cap layer resin and substrate resin for each sample condition are shown in Table 6.

The weathering test and erosion test of these co-extruded films were performed similar to Example 7. For both Sample #9 and #10, the cap layers comprise a high amount of UV absorber (8 wt % Tinuvin 360 or 8 wt % Tinunvin1577), and the "plate-out" of UV absorbers onto the nip rollers that contact and cool the hot polymer web from the film extrusion die were observed within a 2 hour (hr) run. Not to be limited by theory, it is believed that the "plate-out" phenomenon is due to the condensation of these UV absorbers' vapor that evaporated from the hot polymer web. "Plate-out", can lead to the contamination of the nip rollers which requires cleaning effort during or after the film run. However, the other samples with the cap layers comprising a RPA-PC block copolymer with 20:80 RPA:PC ratio (i.e., SLX2080) and up to 5 wt % Tinuvin 1577 or up to 5 wt % Tinuvin 360 did not show "plate-out" of UV absorber during the film extrusion process. Samples #12 and #15 with the caplayer comprising SLX2080 and 5% Tinuvin 1577 also show almost equivalent erosion rate as Sample #10. We expect about 3.3 micrometers per year (μm/yr) of erosion for the film Samples #12 and #15 so that a 4 mil (102 μm) cap layer is expected to weather for greater than 25 years outdoors.

In addition, the thermal shrinkage rates of these film samples were measured after the film samples were exposed to 150° C. for 30 minutes (min) and then cooled down to room temperature. The shrinkage rate was calculated as the change of the film dimension after the above thermal treatment along either MD (i.e. the extrusion direction of films) or TD (i.e. the cross-web direction of films) versus the original film dimension along that direction. It is also noted that the films with the brominated polycarbonate (Br—PC) as the substrate showed a much less thermal shrinkage than those with regular polycarbonate (i.e., BPA-PC) as the substrate. Hence, Coex Sample #15 in this example has the best combination of a low erosion rate and a low thermal shrinkage.

TABLE 6

Formulations and erosion rates for co-extruded PC films

| Coex sample # | Cap layer resin | Substrate resin | "plate-out" observed | ER (μm/MJ/m$^2$) | SR MD (%) | SR TD (%) |
|---|---|---|---|---|---|---|
| 9 | PC + 8 wt % Tinuvin360 | PC | yes | 1.6 | 1.2% | 1.2% |
| 10 | PC + 8 wt % Tinuvin1577 | PC | yes | 1.0 | 2.7% | 1.4% |
| 11 | SLX2080 + 3 wt % Tinuvin1577 | PC | No | 1.2 | 2.6% | 1.3% |
| 12 | SLX2080 + 5 wt % Tinuvin1577 | PC | No | 1.1 | 1.2% | 1.1% |
| 13 | SLX2080 + 5 wt % Tinuvin360 | PC | No | 1.4 | 2.0% | 1.2% |

TABLE 6-continued

Formulations and erosion rates for co-extruded PC films

| Coex sample # | Cap layer resin | Substrate resin | "plate-out" observed | ER (μm/MJ/m²) | SR MD (%) | SR TD (%) |
|---|---|---|---|---|---|---|
| 14 | SLX2080 + 3 wt % Tinuvin1577 | Br-PC | No | 1.3 | 0.6% | 0.6% |
| 15 | SLX2080 + 5 wt % Tinuvin1577 | Br-PC | No | 1.1 | 0.6% | 0.2% |
| 16 | SLX2080 + 5 wt % Tinuvin360 | Br-PC | No | 1.2 | 0.2% | 0.2% |

SLX2080 is the 20:80 RPA:PC (based on weight) copolymer.
Br-PC is the blend of 50 wt % BPA-PC and 50 wt % TBBPA-BPA copolymer where TBBPA:BPA ratio is 25:75 based on weight.
ER is erosion rate.
SR is shrinkage rate.

Previously, optoelectronic devices needed to be formed of glass in order to meet the warranty requirements. Intrinsically highly weatherable polymers such as ETFE can be used for glazing, but the inherently expensive polymers must be used as very thin films (less than 5 mils or less than 127 μm) to avoid prohibitively high cost. This makes the module subject to mechanical damage such as cuts and punctures that allow liquid water to penetrate and degrade the device. Engineering polymers such as BPA polycarbonate and poly(ethylene terephthalate) are a fraction of the cost of fluorinated polymers. The present design, a result of careful and non-obvious choices of weathering protection methods, allows the use of thicker (greater than or equal to 5 mils or greater than or equal to 127 μm) films of less expensive and mechanically tougher polymers then fluorinated polymers while meeting extreme weatherability requirements and at similar or lower cost.

As can be seen in the above examples, the desired erosion rate can be attained with a UV absorber concentration of greater than or equal to 3 weight percent (wt %), specifically, greater than or equal to 4 wt %, and more specifically, greater than or equal to 5 wt %, based upon a total weight of the weatherable coating. Based upon this data, a percentage of greater than 2.5 wt % UV absorber (based upon a total weight of the coating, is believed possible to attain an erosion rate of less than 1.67 μm/MJ/m².

The coated element of the optoelectronic assembly can be on the front side (i.e., the side facing the viewer or sun), or on the back side, e.g., the side opposite the front side. For example, as illustrated in FIG. 4, the coated element can be on the front side of the assembly, where the front side faces to the viewer (e.g., in light emitting diode applications) or the sun (e.g., in photovoltaic module applications). In FIG. 5, the coated element is illustrated on the back side of the assembly, where the back side faces away from the viewer (e.g., in light emitting diode applications) or away from the sun (e.g., in photovoltaic module applications).

As is shown in the figures, the optoelectronic assembly can comprise an optional adhesive layer (encapsulant) 22 on one or both sides of the optoelectronic device 24. For example, the adhesive layer(s) 22 can be in physical contact with the optoelectronic device 24. The weathering layer 12 can, for example, be located on the side of the optoelectronic device 24 to be directly exposed to the weathering conditions. This weathering layer 12 can be the outermost layer (e.g., not covered by another layer), and can optionally comprise a surface texture 30. Between the weathering layer 12 and the optoelectronic device 24 is the substrate 16, and optionally an additional substrate 32 that can be the same or different than the substrate 16 (e.g., one can comprise PET and on can comprise PC). Between the substrate 16 and the optoelectronic device 24 can be optional leveling layer(s) 18, optional oxygen/moisture barrier layer(s) 20, and optionally the adhesive layer(s) 22. Between the weathering layer 12 and the substrate 16 can be optional primer layer(s) 14. On the side of the optoelectronic device 24 that is opposite to the weathering layer 12 can be a transparent front sheet 28 with optional adhesive layer(s) 22 between the front sheet 28 and the optoelectronic device 24. The front sheet 28 can be a transparent material such as a glass, plastic, or the like.

In another embodiment of the optoelectronic assembly, the coated elements are on the both sides of the assembly (Figure not shown).

In an embodiment, an optoelectronic device assembly can comprise: a coated element and an optoelectronic device, wherein the optoelectronic device is selected from a light emitting diode and a photovoltaic cell. The coated element can comprise: transparent thermoplastic substrate and a protective weathering layer. The transparent thermoplastic substrate can comprise a material selected from aromatic polycarbonate and polyester, and combinations comprising at least one of the foregoing materials. The protective weathering layer can have a UV absorbance loss rate at 330 nm of less than or equal to 0.15 A/year as estimated from filtered xenon arc exposure and/or having a rate of erosion of less than or equal to 5 μm per year as estimated from filtered xenon arc exposure.

In an embodiment, an optoelectronic device assembly can comprise a coated element, an optoelectronic device, and an encapsulant (also referred to as adhesive layer) located between the optoelectronic device and the substrate. The optoelectronic device can be selected from a light emitting diode and a photovoltaic cell. The coated element can comprise a transparent thermoplastic substrate, a protective weathering layer, and a primer located between the weathering layer and the substrate. The transparent thermoplastic substrate can comprise a material selected from aromatic polycarbonate and polyester, and combinations comprising at least one of the foregoing materials, optionally, the group can consist of polycarbonate and polyester. The a protective weathering layer can have UV absorbance loss rate at 330 nm of less than or equal to 0.15 A/year as estimated from filtered xenon arc exposure and/or having a rate of erosion of less than or equal to 5 μm per year as estimated from filtered xenon arc exposure.

In an embodiment, an optoelectronic device assembly comprises: a coated element and an optoelectronic device (e.g., on the coated element). The coated element can comprise transparent thermoplastic substrate comprising a bisphenol-A polycarbonate homopolymer and a polycarbonate copolymer, and wherein the polycarbonate copolymer is selected from a copolymer of tetrabromobisphenol A carbonate and BPA carbonate; a copolymer of 2-phenyl-3,3-bis(4-hydroxyphenyl)phthalimidine carbonate and BPA carbonate; a copolymer of 4,4'-(1-phenylethylidene)biphenol carbonate and BPA carbonate; a copolymer of 4,4'-(1-methylethylidene)bis[2,6-dimethyl-phenol]carbonate and BPA carbonate; and combinations comprising at least one of the foregoing; and a protective weathering layer. The protective weathering layer comprises: a) a block copolymer comprising resorcinol polyarylate and polycarbonate; and/or b) polycarbonate and greater than or equal to 5 wt % UV absorber. The optoelectronic device can be selected from a light emitting diode and a photovoltaic cell.

In the various embodiments, (i) the protective weathering layer can comprise a UV absorber selected from 4,6-dibenzoylresorcinol, silylated 4,6-dibenzoylresorcinols, 2,4-diphenyl-6-(2'-hydroxy-4'alkoxyphenyl)-1,3,5-triazines, and combinations comprising at least one of the foregoing; and/or (ii) the protective weathering layer can further comprise a matrix selected from silicone, poly(meth)acrylates, polycarbonates, and combinations comprising at least one of the foregoing; and/or (iii) the protective weathering layer comprises resorcinol polyarylate; and/or (iv) the protective weathering layer comprises a block copolymer of the resorcinol polyarylate and polycarbonate; and/or (v) the block copolymer has a resorcinol polyarylate blocks content of less than or equal to 40 wt %; and/or (vi) the block copolymer has a resorcinol polyarylate blocks content of less than or equal to 30 wt %; and/or (vii) the block copolymer has a resorcinol polyarylate blocks content of less than or equal to 20 wt %; and/or (viii) the transparent thermoplastic substrate has a thermal shrinkage ratio of less than 1% along both the extrusion direction and the cross-web direction after a 30-minute treatment at 150° C.; and/or (ix) the transparent thermoplastic substrate and protective weathering layer are co-extruded; and/or (x) the protective weathering layer can comprise resorcinol polyarylate; and/or (xi) the device can further comprise a barrier coating layer comprising a first zone of a substantially organic in composition and a second zone of a substantially inorganic in composition (e.g., wherein "substantially" is greater than or equal to 75 wt % based upon a total weight of the zone); and/or (xii) the device can further comprise a UV-cured acrylic-colloidal silica coating layer; and/or (xiii) the device can further comprise a planarizing layer selected from an epoxy based resin, an acrylic based resin, a silicone resin, and a combination comprising at least one of the foregoing; and/or (xiv) the planarizing layer can have a thickness of 1 nm to 100 μm; and/or (xv) the thermoplastic polycarbonate can comprise a bisphenol-A polycarbonate homopolymer and a polycarbonate copolymer, and wherein the polycarbonate copolymer is selected from a copolymer of tetrabromobisphenol A carbonate and BPA carbonate; a copolymer of 2-phenyl-3,3-bis(4-hydroxyphenyl)phthalimidine carbonate and BPA carbonate; a copolymer of 4,4'-(1-phenylethylidene)biphenol carbonate and BPA carbonate; a copolymer of 4,4'-(1-methylethylidene)bis[2,6-dimethyl-phenol]carbonate and BPA carbonate; and combinations comprising at least one of the foregoing; and/or (xvi) transparent thermoplastic substrate can be in direct physical contact with the protective weathering layer; and/or (xvii) the coated element can be free of an adhesive layer between the transparent thermoplastic substrate and the protective weathering layer; and/or (xviii) the protective weathering layer can comprise triazine of the formula:

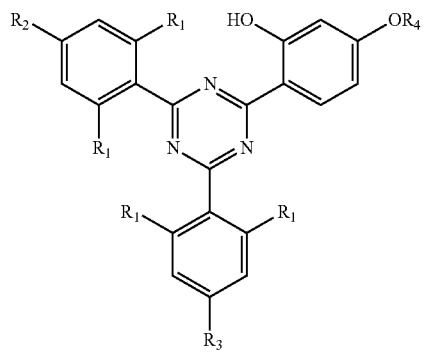

wherein $R_1$=H, $R_2$, $R_3$=independently H, aliphatic $C_1$-$C_{12}$, cycloaliphatic $C_3$-$C_{12}$, or aromatic, $R_4$=H, $C_1$-$C_{24}$ aliphatic, or $C_3$-$C_{24}$ cycloaliphatic; and/or (xix) $R_1$, $R_2$, and $R_3$ can equal H; and/or (XX) $R_4$ can be $C_6H_{13}$; and/or (xxi) $R_4$ can be $CH_2CH_2OOCC_7H_{15}$; and/or (xxii) the protective weathering layer can comprise dibenzoylresorcinol of the formula:

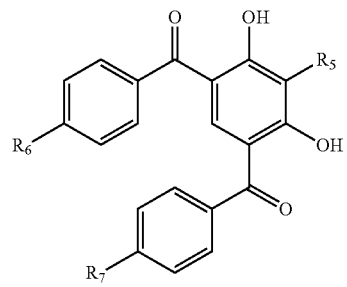

wherein $R_5$=H, aliphatic $C_1$-$C_{12}$, cycloaliphatic $C_3$-$C_{12}$, $CH_2CH_2CH_2SiR_n(OR_8)_{3-n}$, n=0-2, $R_8$=H, aliphatic $C_1$-$C_{12}$; and $R_6$, $R_7$=independently H, aliphatic $C_1$-$C_{12}$, cycloaliphatic $C_3$-$C_{12}$, or aromatic; and/or (xxiii) $R_5$, $R_6$, and $R_7$ can be H; and/or (xxiv) the protective weathering layer can comprise dibenzoylresorcinol of the formula:

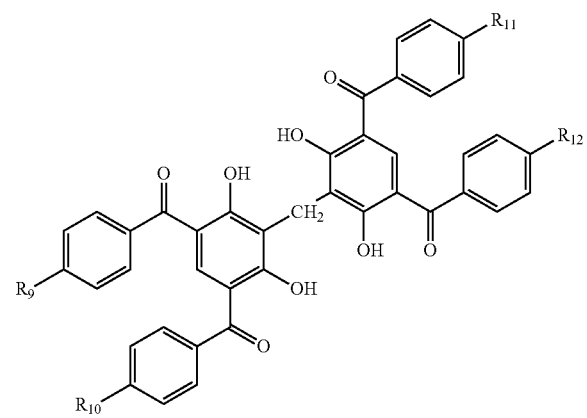

wherein $R_9$, $R_{10}$, $R_{11}$, $R_{12}$ are independently H, aliphatic $C_1$-$C_{12}$, cycloaliphatic $C_3$-$C_{12}$, or aromatic; and/or (xxv) the protective weathering layer has an engineered surface texture selected from a plurality of lenses, microlenses, linear prisms, prisms, pyramids, lenticular structures, and combinations comprising at least one of the foregoing; and/or (xxvi) the engineered surface texture is on a side of the protective weathering layer opposite the substrate; and/or (xxvii) further comprising a primer located between the weathering layer and the substrate; and/or (xxviii) further comprising an adhesive layer located between the optoelectronic device and the substrate; and/or (xxix) wherein the rate of erosion is less than or equal to 4 μm per year as estimated from filtered xenon arc exposure; and/or (xxx) wherein the rate of erosion is less than or equal to 3.5 μm per year as estimated from filtered xenon arc exposure; and/or (xxxi) the protective weathering layer comprises a block copolymer comprising the resorcinol polyarylate and the polycarbonate, and wherein the block copolymer has a resorcinol polyarylate block content of greater than or equal to 80 wt % and, optionally, without an additional UV absorber; and/or (xxxii) the protective weathering layer comprises a block copolymer comprising the resorcinol polyarylate and the polycarbonate, and wherein the block copolymer has a resorcinol polyarylate block content of less than or equal to 40 wt %; and/or (xxxiii) the thermoplastic polycarbonate can comprise a bisphenol-A polycarbonate homopolymer and a polycarbonate copolymer, and wherein the polycarbonate copolymer is selected from a copolymer of tetrabromobisphenol A carbonate and BPA carbonate; a copolymer of 2-phenyl-3,3-bis(4-hydroxyphenyl)phthalimidine carbonate and BPA carbonate; a copolymer of 4,4'-(1-phenylethylidene)biphenol carbonate and BPA carbonate; a copolymer of 4,4'-(1-methylethylidene)bis[2,6-dimethyl-phenol]carbonate and BPA carbonate; and combinations comprising at least one of the foregoing; and/or (xxxiv) wherein the protective weathering layer comprises greater than or equal to 2.5 wt % of a UV absorbers, based upon a total weight of the protective weathering layer.

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to distinguish one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

All cited patents, patent applications, and other references are incorporated herein by reference in their entirety. However, if a term in the present application contradicts or conflicts with a term in the incorporated reference, the term from the present application takes precedence over the conflicting term from the incorporated reference While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An optoelectronic device assembly comprising:
    a coated element, comprising
        thermoplastic substrate comprising a bisphenol-A polycarbonate homopolymer and a polycarbonate copolymer, and wherein the polycarbonate copolymer is selected from a copolymer of tetrabromobisphenol A carbonate and BPA carbonate; a copolymer of 2-phenyl-3,3-bis(4-hydroxyphenyl)phthalimidine carbonate and BPA carbonate; a copolymer of 4,4'-(1-phenylethylidene)biphenol carbonate and BPA carbonate; a copolymer of 4,4'-(1-methylethylidene)bis[2,6-dimethyl-phenol]carbonate and BPA carbonate; and combinations comprising at least one of the foregoing; and
        a protective weathering layer comprising resorcinol polyarylate and polycarbonate; and
    an optoelectronic device on the coated element, wherein the optoelectronic device is selected from a light emitting diode and a photovoltaic cell.

2. The assembly of claim 1, wherein the protective weathering layer comprises greater than or equal to 2.5 wt % of a UV absorbers, based upon a total weight of the protective weathering layer, wherein the UV absorber is selected from 4,6-dibenzoylresorcinol, silylated 4,6-dibenzoylresorcinols, 2,4-diphenyl-6-(2'-hydroxy-4'alkoxyphenyl)-1,3,5-triazines, and combinations comprising at least one of the foregoing.

3. The assembly of claim 1, wherein the protective weathering layer comprises triazine of the formula:

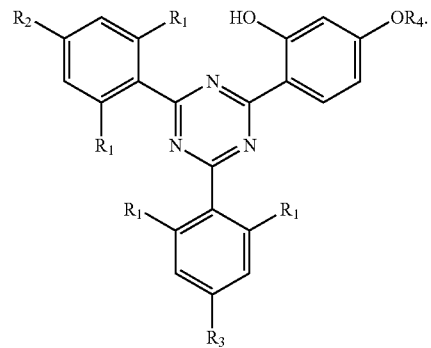

wherein $R_1$=H, $R_2$, $R_3$=independently H, aliphatic $C_1$-$C_{12}$, cycloaliphatic $C_3$-$C_{12}$, or aromatic, $R_4$=H, $C_1$-$C_{24}$ aliphatic, or $C_3$-$C_{24}$ cycloaliphatic.

4. The assembly of claim 3, wherein $R_1$, $R_2$, and $R_3$=H.

5. The assembly of claim 4, wherein $R_4=C_6H_{13}$.

6. The assembly of claim 4, wherein $R_4=CH_2CH_2OOCC_7H_{15}$.

7. The assembly of claim 1, wherein the protective weathering layer comprises a block copolymer comprising the resorcinol polyarylate and the polycarbonate, and wherein the block copolymer has a resorcinol polyarylate block content of less than or equal to 40 wt %.

8. The assembly of claim 1, wherein the protective weathering layer further comprises a matrix selected from silicone, poly(meth)acrylates, polycarbonates, and combinations comprising at least one of the foregoing.

9. The assembly of claim 1, wherein the protective weathering layer has an engineered surface texture selected from a plurality of lenses, microlenses, linear prisms, prisms, pyramids, lenticular structures, and combinations comprising at least one of the foregoing.

10. The assembly of claim 9, wherein the engineered surface texture is on a side of the protective weathering layer opposite the thermoplastic substrate.

11. The assembly of claim 1, wherein the thermoplastic substrate has a thermal shrinkage ratio less than 1% along both the extrusion direction and the cross-web direction after a 30-minute treatment at 150° C.

12. The assembly of claim 1, wherein the thermoplastic substrate and protective weathering layer are co-extruded.

13. The assembly of claim 1, further comprising a barrier coating layer comprising at least one zone substantially organic in composition and at least one zone substantially inorganic in composition.

14. The assembly of claim 1, further comprising a planarizing layer selected from an epoxy based resin, an acrylic based resin, a silicone resin, and a combination comprising at least one of the foregoing.

15. The assembly of claim 14, wherein the planarizing layer has a thickness of 1 nm to 100 μm.

16. The assembly of claim 1, further comprising a UV-cured acrylic-colloidal silica coating layer.

17. The assembly of claim 1, wherein the protective weathering layer comprises dibenzoylresorcinol of the formula:

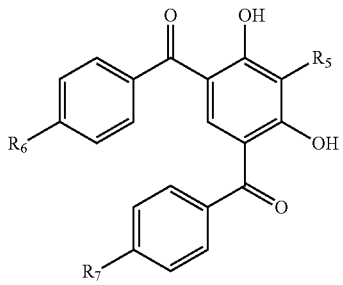

wherein $R_5$=H, aliphatic $C_1$-$C_{12}$, cycloaliphatic $C_3$-$C_{12}$, $CH_2CH_2CH_2SiR_n(OR_8)_{3-n}$, n=0-2, $R_8$=H, aliphatic $C_1$-$C_{12}$; and $R_6$, $R_7$=independently H, aliphatic $C_1$-$C_{12}$, cycloaliphatic $C_3$-$C_{12}$, or aromatic.

18. The assembly of claim 17, wherein $R_5$, $R_6$, and $R_7$=H.

19. The assembly of claim 1, wherein the protective weathering layer comprises dibenzoylresorcinol of the formula:

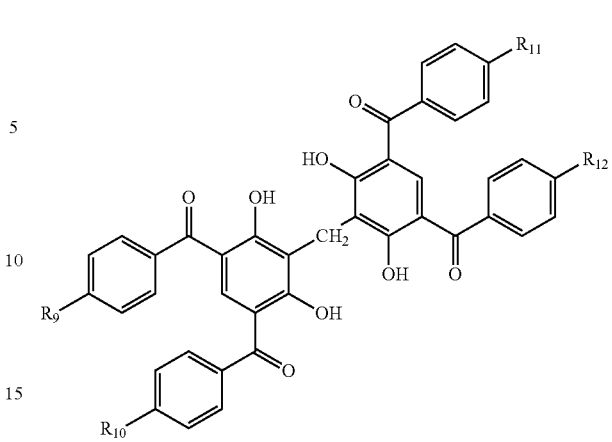

wherein $R_9$, $R_{10}$, $R_{11}$, $R_{12}$ are independently H, aliphatic $C_1$-$C_{12}$, cycloaliphatic $C_3$-$C_{12}$, or aromatic.

20. The assembly of claim 19, wherein the thermoplastic polycarbonate comprises a bisphenol-A polycarbonate homopolymer and a polycarbonate copolymer, and wherein the polycarbonate copolymer is selected from a copolymer of tetrabromobisphenol A carbonate and BPA carbonate; a copolymer of 2-phenyl-3,3-bis(4-hydroxyphenyl)phthalimidine carbonate and BPA carbonate; a copolymer of 4,4'-(1-phenylethylidene)biphenol carbonate and BPA carbonate; a copolymer of 4,4'-(1-methylethylidene)bis[2,6-dimethylphenol]carbonate and BPA carbonate; and combinations comprising at least one of the foregoing.

21. The assembly of claim 1, further comprising a primer located between the weathering layer and the thermoplastic substrate.

22. The assembly of claim 1, further comprising an adhesive layer located between the optoelectronic device and the thermoplastic substrate.

23. An optoelectronic device assembly comprising:
 a coated element, comprising
  thermoplastic substrate comprising a material selected from aromatic polycarbonate and polyester, and combinations comprising at least one of the foregoing materials; and
  a protective weathering layer comprises a UV absorber and a block copolymer comprising the resorcinol polyarylate and the polycarbonate, wherein the block copolymer has a resorcinol polyarylate block content of less than or equal to 40 wt %;
 an optoelectronic device on the coated element, wherein the optoelectronic device is selected from a light emitting diode and a photovoltaic cell.

24. The assembly of claim 23, wherein the thermoplastic substrate comprises a bisphenol-A polycarbonate homopolymer and a polycarbonate copolymer, and wherein the polycarbonate copolymer is selected from a copolymer of tetrabromobisphenol A carbonate and BPA carbonate; a copolymer of 2-phenyl-3,3-bis(4-hydroxyphenyl)phthalimidine carbonate and BPA carbonate; a copolymer of 4,4'-(1-phenylethylidene)biphenol carbonate and BPA carbonate; a copolymer of 4,4'-(1-methylethylidene)bis[2,6-dimethylphenol]carbonate and BPA carbonate; and combinations comprising at least one of the foregoing.

25. The assembly of claim 23, wherein the protective weathering layer has a UV absorbance loss rate at 330 nm of less than or equal to 0.15 A/year as estimated from filtered xenon arc exposure and/or having a rate of erosion of less than or equal to 5 μm per year as estimated from filtered xenon arc exposure.

* * * * *